US012615946B2

(12) United States Patent
Cheng et al.

(10) Patent No.:  US 12,615,946 B2
(45) Date of Patent:      Apr. 28, 2026

(54) DISPLAY SUBSTRATE, DISPLAY PANEL AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yudiao Cheng, Beijing (CN); Fengli Ji, Beijing (CN); Yanwei Lu, Beijing (CN); Zhuoran Yan, Beijing (CN); Hongjun Zhou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 481 days.

(21) Appl. No.: 18/260,405

(22) PCT Filed: Jun. 30, 2022

(86) PCT No.: PCT/CN2022/102693
§ 371 (c)(1),
(2) Date: Jul. 5, 2023

(87) PCT Pub. No.: WO2024/000361
PCT Pub. Date: Jan. 4, 2024

(65) Prior Publication Data
US 2024/0381740 A1      Nov. 14, 2024

(51) Int. Cl.
*H10K 59/80*        (2023.01)
*H10K 59/131*       (2023.01)

(52) U.S. Cl.
CPC ....... *H10K 59/8722* (2023.02); *H10K 59/131* (2023.02); *H10K 59/873* (2023.02)

(58) Field of Classification Search
None
See application file for complete search history.

(56) References Cited

U.S. PATENT DOCUMENTS

2006/0055313 A1    3/2006  Bae et al.
2015/0090982 A1    4/2015  Lin et al.
(Continued)

FOREIGN PATENT DOCUMENTS

CN        212062439 U      12/2020
CN        113421905 A       9/2021
CN        113539177 A      10/2021

*Primary Examiner* — Kyoung Lee
(74) *Attorney, Agent, or Firm* — Dority & Manning, P.A.

(57) ABSTRACT

A display substrate has a display region, an encapsulation region and a peripheral region. The display substrate includes a base substrate, a pixel definition layer, and a photo spacer layer. The photo spacer layer includes a plurality of peripheral photo spacers disposed in the peripheral region. A direction perpendicular to a border of the display region adjacent to the plurality of peripheral photo spacers is a first direction. In the first direction, a distance from a peripheral photo spacer of the plurality of peripheral photo spacers closest to the encapsulation region to the encapsulation region is a first distance, and a distance from the peripheral photo spacer of the plurality of peripheral photo spacers closest to the encapsulation region to the display region is a second distance. The first distance is less than or equal to the second distance.

20 Claims, 16 Drawing Sheets

(56)  References Cited

U.S. PATENT DOCUMENTS

| 2020/0212356 | A1 | 7/2020 | Kim et al. |
| 2020/0303672 | A1 | 9/2020 | Wang et al. |
| 2021/0072853 | A1 | 3/2021 | Tan et al. |
| 2021/0159287 | A1 | 5/2021 | Cheng et al. |
| 2024/0224715 | A1* | 7/2024 | You .................... H10K 59/8723 |

* cited by examiner

37

38

44

281          2

First direction

DISPLAY SUBSTRATE, DISPLAY PANEL AND ELECTRONIC DEVICE

CROSS-REFERENCE TO RELATED APPLICATION

This application is a national phase entry under 35 USC 371 of International Patent Application No. PCT/CN2022/102693, filed on Jun. 30, 2022, which is incorporated herein by reference in its entirety.

TECHNICAL FIELD

The present disclosure relates to the field of display technologies, and in particular, to a display substrate, a display panel and an electronic device.

BACKGROUND

Organic light-emitting diodes (OLEDs) have been widely used in the display field due to their advantages of high brightness, full viewing angle, fast response, flexible display, etc.

SUMMARY

In an aspect, a display panel is provided. The display panel has a display region, an encapsulation region and a peripheral region, the encapsulation region is located outside the display region, and the peripheral region is located between the display region and the encapsulation region.

The display substrate includes a base substrate, a pixel definition layer and a photo spacer layer.

The pixel definition layer is disposed on a side of the base substrate, and the photo spacer layer is disposed on a side of the pixel definition layer away from the base substrate.

The photo spacer layer includes a plurality of peripheral photo spacers disposed in the peripheral region. A direction perpendicular to a border of the display region adjacent to the plurality of peripheral photo spacers is a first direction; in the first direction, a distance from a peripheral photo spacer of the plurality of peripheral photo spacers closest to the encapsulation region to the encapsulation region is a first distance, and a distance from the peripheral photo spacer of the plurality of peripheral photo spacers closest to the encapsulation region to the display region is a second distance.

The first distance is less than or equal to the second distance.

In some embodiments, a size of the peripheral region in a direction perpendicular to a border of the display region adjacent to the peripheral region is a width of the peripheral region, and a ratio of the first distance to the width of the peripheral region is less than or equal to 0.2.

In some embodiments, in the first direction, the peripheral photo spacer of the plurality of peripheral photo spacers closest to the encapsulation region is a first peripheral photo spacer, and a peripheral photo spacer of the plurality of peripheral photo spacers closest to the display region is a second peripheral photo spacer.

The distance between the first peripheral photo spacer and the second peripheral photo spacer is greater than or equal to 80% of the width of the peripheral region.

In some embodiments, the plurality of peripheral photo spacers are arranged in rows in the first direction and in columns in a second direction. The second direction is perpendicular to the first direction.

In some embodiments, in the first direction, a maximum distance between adjacent two peripheral photo spacers is $L_{MAX}$, and a minimum distance between adjacent two peripheral photo spacers is $L_{MIN}$.

$$L_{MAX} \leq 20 \times L_{MIN}.$$

In some embodiments, the first distance is less than or equal to $L_{MAX}$, and the first distance is less than or equal to 260 μm.

In some embodiments, the display substrate further includes a plurality of display photo spacers disposed in the display region.

An area proportion of the plurality of peripheral photo spacers in the peripheral region is a first proportion, an area proportion of the plurality of display photo spacers in the display region is a second proportion, and the first proportion is less than the second proportion.

In some embodiments, a ratio of the first proportion to the second proportion is less than or equal to 65%.

In some embodiments, at least one peripheral photo spacer has the same shape and size as at least one display photo spacer.

In some embodiments, the plurality of display photo spacers are arranged in rows and columns, and the plurality of peripheral photo spacers are arranged in rows and columns; and at least one row of peripheral photo spacers and one row of display photo spacers are located on a same straight line, and a number of rows of display photo spacers is greater than a number of rows of peripheral photo spacers.

In some embodiments, the plurality of display photo spacers are arranged in rows and columns, and the plurality of peripheral photo spacers are arranged in rows and columns; and a row of peripheral photo spacers and a row of display photo spacers constitute a photo spacer row, and in the photo spacer row, a distance between at least some adjacent peripheral photo spacers is equal to a distance between adjacent display photo spacers.

In some embodiments, the display substrate further includes a first voltage signal line and a transfer portion.

The first voltage signal line is disposed on the base substrate and configured to transmit a cathode signal to the display region.

The transfer portion is disposed in the peripheral region, the transfer portion is electrically connected to the first voltage signal line, and an edge of the transfer portion proximate to the display region and the display region have a first gap therebetween.

In the direction perpendicular to the border of the display region, a spacing of the first gap is greater than the first distance.

In some embodiments, in the direction perpendicular to the border of the display region, the spacing of the first gap is greater than or equal to 300 μm.

In some embodiments, an orthographic projection of part of peripheral photo spacers of the plurality of peripheral photo spacers on the base substrate overlaps with an orthographic projection of the transfer portion on the base substrate.

The part of peripheral photo spacers of the plurality of peripheral photo spacers are disposed in the first gap; and/or an edge of the transfer portion proximate to the encapsulation region and the encapsulation region have a second gap therebetween, and the part of peripheral photo spacers of the plurality of peripheral photo spacers are disposed in the second gap.

In some embodiments, the display substrate further includes photo spacer pads disposed on sides of peripheral photo spacers proximate to the base substrate; and the pixel definition layer and the photo spacers are arranged in the same layer.

In some embodiments, the transfer portion includes through holes, the display substrate further comprises filling portions filling the through holes, and the filling portions are arranged in the same layer as the pixel definition layer.

In some embodiments, the display substrate further includes a first electrode layer, and the first electrode layer includes the transfer portion and a plurality of anodes located in the display region.

In some embodiments, the transfer portion is a closed structure surrounding the display region.

In some embodiments, the display substrate further includes a plurality of scan signal lines.

The peripheral region includes a first region and a second region distributed on two sides of the display region in an extending direction of the plurality of scan signal lines.

The display substrate further includes a scan driving circuit disposed in the first region and/or the second region, and the scan driving circuit is electrically connected to the plurality of scan signal lines.

An edge of an orthographic projection, on the base substrate, of the scan driving circuit proximate to the display region is closer to the display region than an edge of an orthographic projection, on the base substrate, of the transfer portion proximate to the display region; and the ortho-graphic projection, on the base substrate, of the transfer portion does not overlap or partially overlaps with the orthographic projection, on the base substrate, of the scan driving circuit.

In some embodiments, the scan driving circuit includes a first driving circuit and a second driving circuit, one of the first driving circuit and the second driving circuit is config-ured to output row scan signals, and another of the first driving circuit and the second driving circuit is configured to output light-emitting control signals.

The first driving circuit is closer to the display region than the second driving circuit.

The orthographic projection, on the base substrate, of the transfer portion at least partially overlaps with an ortho-graphic projection, on the base substrate, of the second driving circuit, and does not overlap with an orthographic projection, on the base substrate, of the first driving circuit; or the orthographic projection, on the base substrate, of the transfer portion does not overlap with the orthographic projection, on the base substrate, of the first driving circuit and the orthographic projection, on the base substrate, of the second driving circuit.

In some embodiments, the scan driving circuit further includes a third driving circuit configured to output reset signals.

In a direction away from the display region, the first driving circuit, the third driving circuit and the second driving circuit are arranged in sequence.

The orthographic projection, on the base substrate, of the transfer portion at least partially overlaps with an ortho-graphic projection, on the base substrate, of the second driving circuit and an orthographic projection, on the base substrate, of the third driving circuit; or the orthographic projection, on base substrate, of the transfer portion at least partially overlaps with the orthographic projection, on the base substrate, of the second driving circuit, and does not overlap with an orthographic projection, on the base sub-strate, of the first driving circuit and the orthographic projection, on the base substrate, of the third driving circuit; or the orthographic projection, on the base substrate, of the transfer portion does not overlap with orthographic projec-tions, on the base substrate, of the first driving circuit, the second driving circuit and the third driving circuit.

In some embodiments, an orthographic projection, on the base substrate, of part of peripheral photo spacers of the plurality of peripheral photo spacers overlaps with ortho-graphic projections, on the base substrate, of the third driving circuit and the second driving circuit.

In some embodiments, the display substrate further includes a plurality of data signal lines.

The peripheral region includes a third region and a fourth region distributed on two sides of the display region in an extending direction of the plurality of data signal lines; the display substrate further has a fan-out region located on a side of the fourth region away from the display region.

The display substrate further includes a time-sharing multiplex circuit disposed in the fourth region, and the time-sharing multiplex circuit is electrically connected to the plurality of data signal lines.

An edge of an orthographic projection, on the base substrate, of the time-sharing multiplex circuit proximate to the display region is closer to the display region than an edge of an orthographic projection, on the base substrate, of the transfer portion proximate to the display region, and the orthographic projection, on the base substrate, of the transfer portion does not overlap with the orthographic projection, on the base substrate, of the time-sharing multiplex circuit.

An orthographic projection, on the base substrate, of part of peripheral photo spacers of the plurality of peripheral photo spacers overlaps with the orthographic projection, on the base substrate, of the time-sharing multiplex circuit.

In some embodiments, the display substrate further includes a gate metal layer and a source-drain layer disposed on the base substrate.

The first voltage signal line includes a first trace portion located in the gate metal layer and a second trace portion located in the source-drain layer.

An orthographic projection, on the base substrate, of the first trace portion is at least partially located in the encap-sulation region, and an orthographic projection, on the base substrate, of the second trace portion is located between the encapsulation region and the display region.

In some embodiments, the display substrate further includes a first electrode layer, a light-emitting layer, and a second electrode layer. The light-emitting layer is disposed on a side of the first electrode layer, and the second electrode layer is disposed on a side of the light-emitting layer away from the first electrode layer.

The first electrode layer includes a plurality of anodes disposed in the display region and a transfer portion dis-posed in the peripheral region, the plurality of anodes and the transfer portion are insulated from each other, and the second electrode layer is electrically connected to the trans-fer portion.

In another aspect, a display panel is provided. The display panel includes a display substrate, an encapsulation adhe-sive, and a protective cover plate. The display substrate is the display substrate as described in the above embodiments. The encapsulation adhesive is disposed in the encapsulation region of the display substrate, and the protective cover plate is disposed on a side of the encapsulation adhesive away from the base substrate.

The protective cover plate is encapsulated on the display substrate by the encapsulation adhesive, and orthographic projections, on the base substrate, of the plurality of peripheral photo spacers of the display substrate overlap with an orthographic projection, on the base substrate, of the protective cover plate.

In some embodiments, surfaces of the peripheral photo spacers away from the base substrate and a surface of the encapsulation adhesive away from the base substrate are flush or approximately flush.

In yet another aspect, an electronic device is provided. The electronic device includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
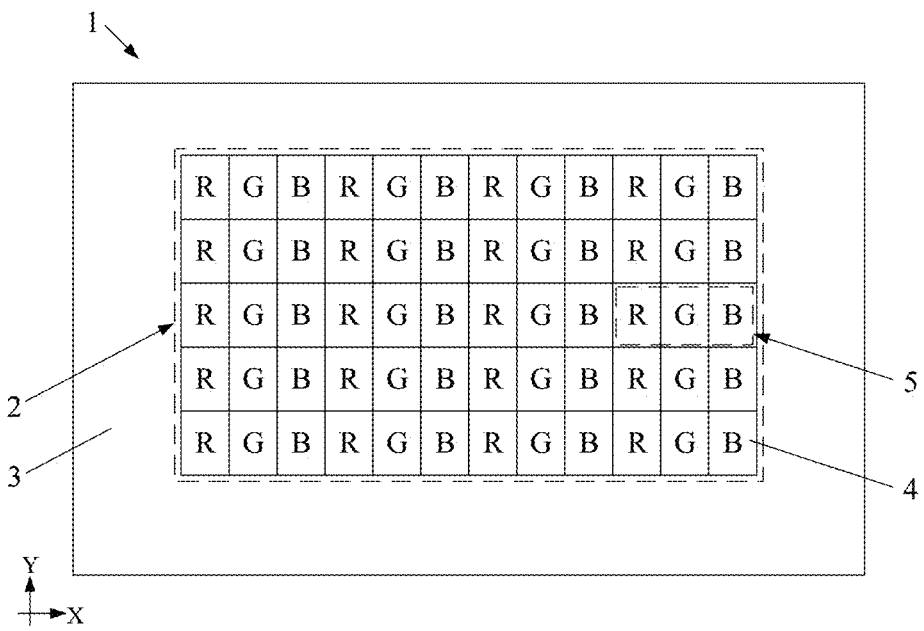
FIG. 1 is a structural diagram of a display substrate, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of features. In the description of the embodiments of the present disclosure, the terms "a plurality of", "the plurality of" and "multiple" each mean two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined" or "if [a stated condition or event] is detected" is optionally construed as "in a case where it is determined", "in response to determining", "in a case where [the stated condition or event] is detected" or "in response to detecting [the stated condition or event]".

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, "parallel", "perpendicular" and "equal" include the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature being curved. Therefore, the regions shown in the accompanying drawings are schematic in nature, and their shapes are not intended to show actual shapes of regions in a device, and are not intended to limit the scope of the exemplary embodiments.

As shown in FIG. 1, some embodiments of the present disclosure provide a display substrate 1, and the display substrate 1 has a display region (i.e., an active area, which is abbreviated as AA) 2 and a non-display region 3 located on a periphery of the display region 2. The display region 2 is a region of the display substrate 1 for realizing the display function. The non-display region 3 is a region of the display substrate 1 that cannot perform display, and is located on the periphery of the display region 2.

The display substrate 1 includes a plurality of pixel units disposed in the display region 2, and the plurality of pixel units are arranged in an array to constitute a pixel array.

For example, the pixel unit of the display panel may include an organic light-emitting diode (OLED), a quantum dot light-emitting diode (QLED), a mini light-emitting diode (LED), or a micro LED. The embodiments of the present disclosure are described by taking an example in which the pixel units are OLED pixel units 5. As for other types of pixel units, reference may be made to the related content of the OLED pixel units 5.

In some embodiments, each OLED pixel unit 5 includes a plurality of OLED sub-pixels 4. For the display substrate 1 capable of realizing color display, each OLED pixel unit 5 may include the plurality of OLED sub-pixels 4 capable of emitting different colors. During the display of the display substrate 1, by controlling light emitting and color mixing of the OLED sub-pixels 4 of different colors in each OLED pixel unit 5, the color display is realized.

For example, the OLED pixel unit 5 includes an R sub-pixel capable of emitting red light, a G sub-pixel capable of emitting green light, and a B sub-pixel capable of emitting blue light. Red, green and blue are the three primary colors. During the display of the display substrate 1, by controlling the light emitting of the R sub-pixel, the G sub-pixel and the B sub-pixel to different degrees, the three colors may be mixed in different proportions, so that the display substrate 1 realizes the color display.

In some embodiments, the OLED pixel unit 5 may also realize full-color display through colorization techniques such as color transfer or color filter.

The pixel arrangement of the OLED sub-pixels 4 in the OLED pixel unit 5 varies, which may be, for example, an RGB arrangement, a GGRB arrangement, a PenTile arrangement (abbreviated as P arrangement), a Delta arrangement (abbreviated as D arrangement), and a diamond arrangement. For different pixel arrangements, the type, number and size of the OLED sub-pixels 4 in the OLED pixel unit 5 may also be different. The pixel arrangement of the OLED sub-pixels 4 in the OLED pixel unit 5 is not limited in the embodiments of the present disclosure.

Figure 2:
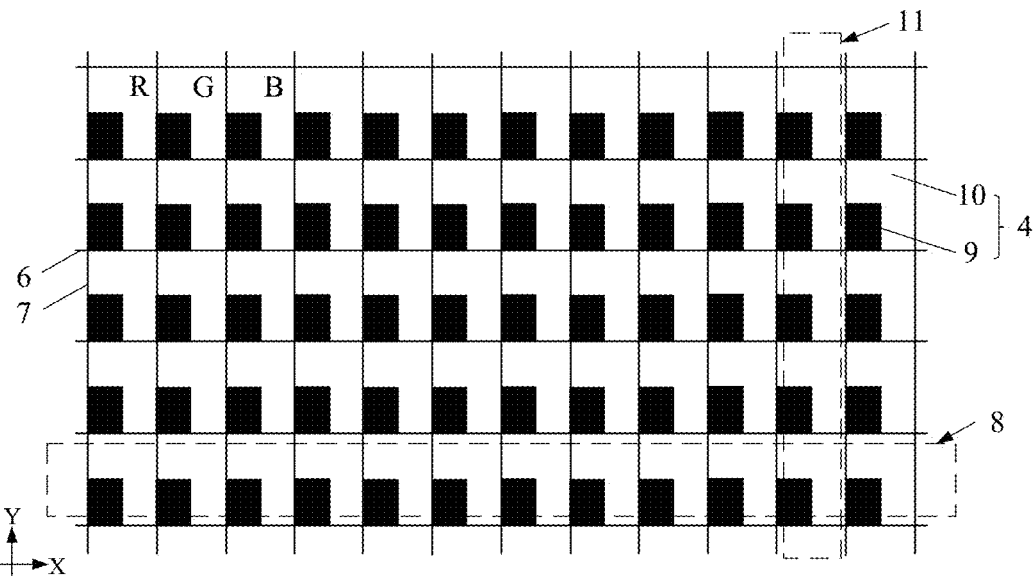
FIG. 2 is a diagram showing a structure of a display substrate in a display region, in accordance with some embodiments.

FIG. 2 is a diagram showing a structure of the display substrate in the display region, in accordance with some embodiments. As shown in FIG. 2, in some embodiments of the present disclosure, a plurality of OLED sub-pixels 4 of the display substrate 1 in the display region 2 are arranged in rows and columns, which includes a plurality of pixel rows 8 extending in a pixel row direction, and a plurality of pixel columns 11 extending in a pixel column direction. The pixel row direction and the pixel column direction are perpendicular to each other, and each pixel row 8 includes multiple OLED sub-pixels 4 arranged in the pixel row direction, and each pixel column 11 includes multiple OLED sub-pixels 4 arranged in the pixel column direction. The plurality of pixel rows 8 in the display region 2 are arranged side by side in the pixel column direction, and the plurality of pixel columns 11 in the display region 2 are arranged side by side in the pixel row direction, so as to form a crossed pixel array.

Considering the orientation shown in FIG. 2 as an example, the pixel row direction is a horizontal direction, which is parallel to a direction of an X coordinate axis in FIG. 2, and the pixel column direction is a vertical direction, which is parallel to a direction of a Y coordinate axis in FIG. 2.

It will be noted that for convenience of the description, the structures herein will be described by taking the direction of the X coordinate axis marked in the drawings as the horizontal direction and the direction of the Y coordinate axis as the vertical direction. Obviously, the horizontal direction and the vertical direction are based on orientations or positional relationships shown in the drawings, which are merely for convenience in description of the present disclosure and simplifying the description, but not to indicate or imply that the referred device or element must have a particular orientation, or must be constructed and operated in a particular orientation. Therefore, they should not be construed as limitations to the present disclosure.

In the display region, each OLED sub-pixel 4 includes an OLED light-emitting device 10 and a pixel driving circuit 9 for driving the OLED light-emitting device 10 to emit light.

Figure 3:
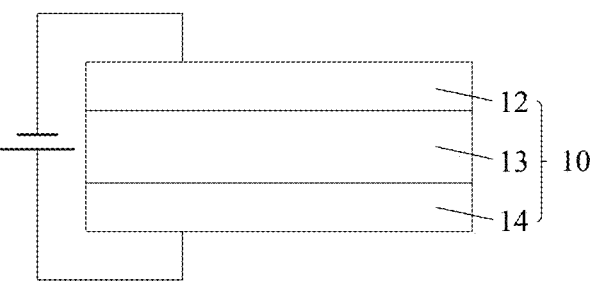
FIG. 3 is a structural diagram of an OLED light-emitting device, in accordance with some embodiments.

FIG. 3 is a structural diagram of the OLED light-emitting device, in accordance with some embodiments. Referring to FIG. 3, the OLED light-emitting device 10 includes an anode 14, an organic functional layer 13, and a cathode 12. The anode 14 is arranged opposite to the cathode 12. The organic functional layer 13 is located between the anode 14 and the cathode 12, and includes an organic light-emitting layer (i.e., an emitting material layer, abbreviated as EML). Organic light-emitting layers corresponding to OLED light-emitting devices 10 of different colors are usually different.

During the display of the display substrate 1, the anode 14 and the cathode 12 are controlled to create an electric field, holes generated by the anode 14 and electrons generated by the cathode 12 will move due to the electric field, and when the holes and the electrons meet, energy excitons are generated, which in turn radiate and recombine to produce visible light for self-luminous display.

The anode 14 may be made of a material with high work function, and the cathode 12 may be made of a material with low work function. The organic functional layer 13 may further include at least one of a hole transport layer (HTL), a hole injection layer (HIL), an electron transport layer (ETL) and an electron injection layer (EIL), so as to improve the light-emitting efficiency of the organic light-emitting layer (EML).

Each OLED sub-pixel 4 further includes the pixel driving circuit 9 for driving the OLED light-emitting device 10 to emit light. The driving manner of the pixel driving circuit 9 is classified to an active-matrix (AM) driving manner.

In some embodiments of the present disclosure, the display substrate 1 adopts an active-matrix driving manner. With continued reference to FIG. 2, the display substrate 1 includes a plurality of scan signal lines (scan lines) 6, a plurality of data signal lines (data lines) 7, and pixel driving circuits 9 corresponding to the OLED sub-pixels 4 that are disposed in the display region 2. The pixel driving circuit 9 includes thin film transistors (TFTs).

It will be noted that the TFT used in the embodiments of the present disclosure includes a source, a gate, and a drain. In some cases, the source and the drain are symmetrical, so that the source and the drain may be interchanged. For convenience of the description, herein, one of the source and the drain is referred to as a first electrode, another of the source and the drain is referred to as a second electrode, and the gate is referred to as a control electrode. That is, when the first electrode is the source, the second electrode is the drain; and when the first electrode is the drain, the second electrode is the source.

The display substrate 1 further includes a first voltage signal line, a second voltage signal line and an initialization voltage signal line. The first voltage signal line is configured to output a VSS voltage signal (i.e., a cathode signal) to the display region 2. The second voltage signal line is configured to output a VDD voltage signal to the display region 2. The initialization voltage signal line is configured to output an initialization voltage signal to the display region 2.

As shown in FIG. 2, the plurality of scan signal lines 6 extend in the pixel row direction, and the plurality of scan signal lines 6 are arranged side by side in the pixel column direction. The plurality of data signal lines 7 extend in the pixel column direction, and the plurality of data signal lines 7 are arranged side by side in the pixel row direction. The plurality of scan signal lines 6 and the plurality of data signal lines 7 intersect. An OLED sub-pixel 4 is located at an intersection of a scan signal line 6 and a data signal line 7.

Considering the orientation shown in FIG. 2 as an example, an extending direction of the scan signal lines 6 is the horizontal direction, and the scan signal lines 6 are arranged side by side in the vertical direction; and an extending direction of the data signal lines 7 is the vertical direction, and there are a plurality of data signal lines 7 arranged in the horizontal direction.

The pixel driving circuit 9 includes at least two TFTs (such as a switching transistor (switching TFT) and a driving transistor (driving TFT)) and at least one storage capacitor. Generally, the number of TFTs and the number of storage capacitor(s) in the pixel driving circuit 9 may be used to abbreviate the pixel driving circuit 9; for example, 2T1C includes two TFTs and one storage capacitor, and 7T1C includes seven TFTs and one storage capacitor; as another example, there further be 5T1C, 4T2C, etc.

Figure 4:
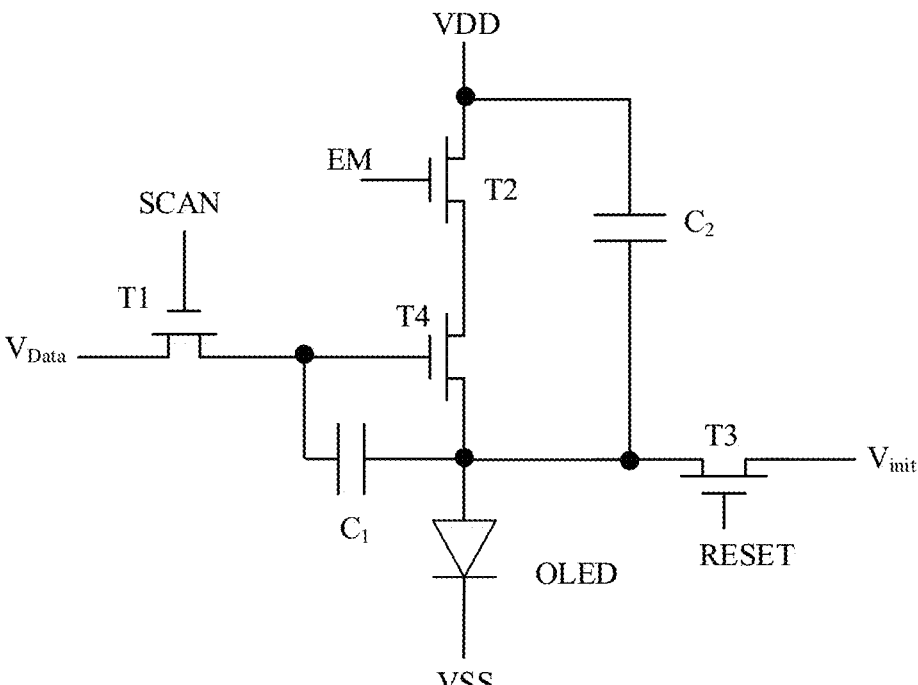
FIG. 4 is a circuit diagram of a 4T2C pixel driving circuit, in accordance with some embodiments.

FIG. 4 is a circuit diagram of a 4T2C pixel driving circuit, in accordance with some embodiments. As shown in FIG. 4, the pixel driving circuit 9 includes a first TFT T1, a second TFT T2, a third TFT T3, and a fourth TFT T4, a first capacitor $C_1$ and a second capacitor $C_2$; and the pixel driving circuit 9 further includes a row scan signal input terminal, a data signal input terminal, a light-emitting signal input terminal, a reset signal input terminal, a first voltage input terminal, a second voltage input terminal, and an initialization voltage input terminal.

The row scan signal input terminal is connected to a scan signal line 6, and is configured to input a row scan signal SCAN. The data signal input terminal is connected to a data signal line 7, and is configured to input a data voltage signal VData. The light-emitting signal input terminal is connected to a light-emitting signal control circuit, and is configured to input a light-emitting signal EM. The reset signal input terminal is connected to a reset signal control circuit, and is configured to input a reset signal RESET for resetting the pixel driving circuit 9. The first voltage input terminal is connected to the first voltage signal line, and is configured to input the VSS voltage signal. The second voltage input terminal is connected to the second voltage signal line, and is configured to input the VDD voltage signal. The initialization voltage input terminal is connected to the initialization voltage signal line, and is configured to input an initialization voltage signal $V_{init}$.

With continued reference to FIG. 4, the first TFT T1 is a switching transistor, a control electrode thereof is connected to the row scan signal input terminal, a first electrode thereof is connected to the data signal input terminal, and a second electrode thereof is connected to a control electrode of the second TFT T2.

The fourth TFT T4 is a driving transistor, a control electrode thereof is connected to the second electrode of the first TFT T1, a first electrode thereof is connected to the second TFT T2, and a second electrode thereof is connected to the anode 14 of the OLED light-emitting device 10. The cathode 12 of the OLED light-emitting device 10 is connected to the first voltage input terminal.

An end of the first capacitor $C_1$ is connected to a control electrode of the fourth TFT T4, and another end of the first capacitor $C_1$ is connected to a second electrode of the fourth TFT T4.

A control electrode of the second TFT T2 is connected to the light-emitting signal input terminal, a first electrode of the second TFT T2 is connected to the second voltage input terminal, and a second electrode of the second TFT T2 is connected to the first electrode of the fourth TFT T4. An end of the second capacitor $C_2$ is connected to the second voltage input terminal, and another end of the second capacitor $C_2$ is connected to the second electrode of the fourth TFT T4. A control electrode of the third TFT T3 is connected to the reset signal input terminal, a first electrode of the third TFT T3 is connected to the initialization voltage input terminal, and a second electrode of the third TFT T3 is connected to the second electrode of the fourth TFT T4.

Figure 5:
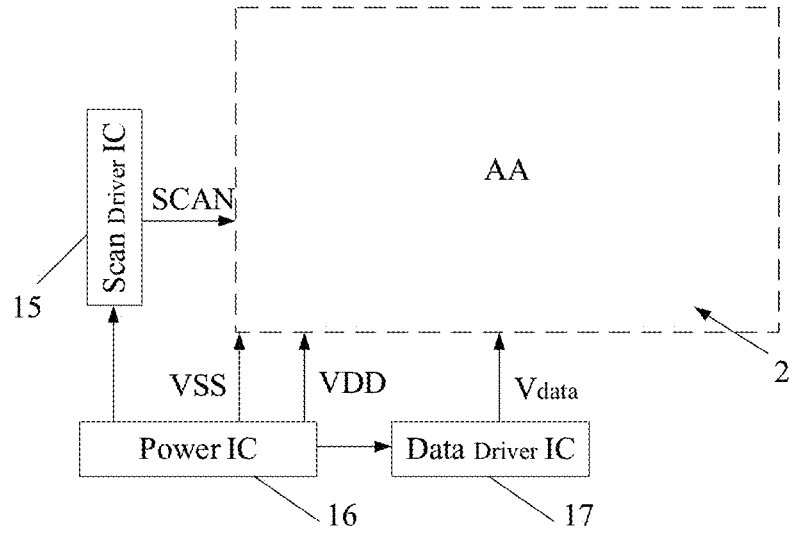
FIG. 5 is a circuit diagram of a display driving circuit, in accordance with some embodiments.

FIG. 5 is a circuit diagram of a display driving circuit, in accordance with some embodiments. As shown in FIG. 5, the display substrate 1 includes the display driving circuit for controlling display, and the display driving circuit includes a scan driving circuit (scan driver integrated circuit (IC)) 15, a data driving circuit (data driver IC) 17 and a power supply circuit (power IC) 16.

The scan driving circuit 15 is connected to the scan signal lines 6 in the display region 2, and is used to output row scan signals SCAN for controlling switching transistors in a display driving period. For different pixel driving circuits 9, the scan driving circuit 15 may be different.

For example, in some embodiments, the scan driving circuit 15 is further configured to output light-emitting control signals EM to light-emitting signal input terminals of the pixel driving circuits 9, and is configured to output reset signals RESET to reset signal input terminals of the pixel driving circuits 9.

The data driving circuit 17 is connected to the data signal lines 7 in the display region 2, and is used to provide data voltage signals Vdata to data signal input terminals of the pixel driving circuits 9 in the display driving period. The data driving circuit 17 usually adopts an integrated circuit chip bonded to the display substrate 1.

The power supply circuit 16 is used to convert an input voltage into operating voltages of different magnitudes and output the operating voltages. For example, the power supply circuit 16 is connected to the first voltage signal line 36, the second voltage signal line and the initialization voltage signal line, and is configured to output the VSS voltage signal, the VDD voltage signal and the initialization voltage signal $V_{init}$ to the display region 2.

In the display substrate in some embodiments of the present disclosure, the scan driving circuit 15 adopts a gate driver on array (GOA) design. That is, the scan driving circuit 15 is integrated on the display substrate. The scan driving circuit 15 integrated on the display substrate by the GOA technology is referred to as a GOA circuit.

The GOA circuit is usually arranged outside ends of the scan signal lines 6 (the pixel rows 8), and includes a plurality of shift register units (GOA units) connected in cascade in the extending direction of the data signal lines 7 (the direction in which the pixel rows 8 are arranged). An output signal of a current-stage shift register unit is output to drive pixel transistors of pixel units in a current row, is further output to a previous-stage shift register unit (if any) as a rest signal of the previous-stage shift register unit, and is further output to a next-stage shift register unit (if any) as an input signal of the next-stage shift register unit.

In the whole GOA circuit, an input signal of a first-stage shift register unit is a frame start signal STV, and the first-stage shift register unit outputs no reset signal. A last-stage shift register unit is connected to a dummy shift register unit (dummy GOA unit) to realize reset of the last-stage shift register unit. It can be seen that the plurality of shift register units that are connected in cascade interact with each other, a shift pulse signal is generated, and the pixel array are scanned row by row.

Figure 6:
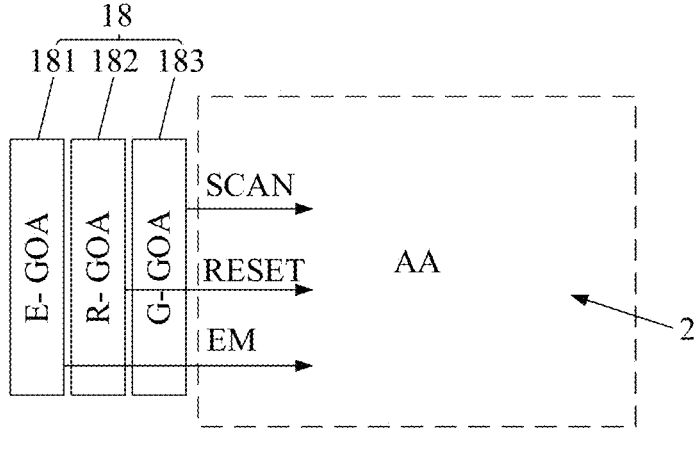
FIG. 6 is a circuit diagram of a GOA circuit, in accordance with some embodiments.

FIG. 6 is a circuit diagram of a GOA circuit, in accordance with some embodiments. As shown in FIG. 6, the GOA circuit 18 includes a scan signal control circuit (Gate GOA, abbreviated as G-GOA) 183, a light-emitting signal control circuit (EM GOA, abbreviated as E-GOA) 181 and a reset signal control circuit (Reset GOA, abbreviated R-GOA) 182. The scan signal control circuit 183 is configured to output row scan signals SCAN in the display driving period. The pixel driving circuit 9 controls the switching transistor to be turned on when receiving the row scan signal SCAN. The light-emitting signal control circuit 181 is configured to output light-emitting signals EM in the display driving period. The pixel driving circuit 9 controls light emitting when receiving the light emitting signal EM. The reset signal control circuit 182 is configured to output reset signals RESET in the display driving period. The pixel driving circuit 9 can realize initialization reset when receiving the reset signal RESET, so as to remove signal(s) that may remain and ensure the display effect of the display substrate 1.

The scan signal control circuit 183 and the reset signal control circuit 182 in the GOA circuit 18 usually adopt an integrated design. That is, the GOA circuit 18 only includes the scan signal control circuit 183 and the light-emitting signal control circuit 181, and the scan signal control circuit 183 not only outputs the row scan signals SCAN for controlling the switching transistors, but also outputs the reset signals RESET to the pixel driving circuits 9.

However, in some application scenarios, for example, in a product with large size and high refresh rate, in order to ensure the driving capabilities of the scan signal control circuit 183 and the reset signal control circuit 182, the reset signal control circuit 182 in the GOA circuit 18 may be set separately.

Figure 7:
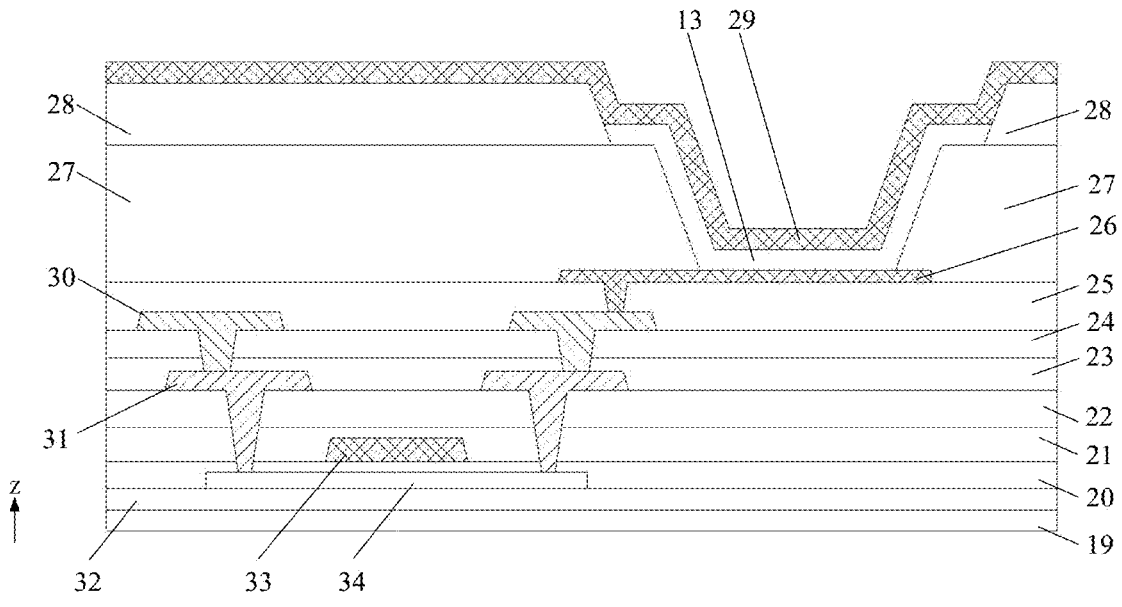
FIG. 7 is a diagram showing stacked layers of a display substrate, in accordance with some embodiments.

FIG. 7 is a diagram showing stacked layers of the display substrate, in accordance with some embodiments. As shown in FIG. 7, the display substrate 1 includes a base substrate 19, and a buffer layer (Buffer) 32, an active layer 34, a first gate insulating layer (GI1) 20, a gate metal layer (Gate) 33, a second gate insulating layer (GI2) 21, an interlayer insulating layer (Inter Layer Dielectric (ILD)) 22, a first source-drain metal layer (SD1) 31, a first planarization layer (Planarization (PLN)) 23, a passivation layer (Passivation (PVX)) 24, a second source-drain metal layer (SD2) 30, and a second planarization layer 25, a pixel definition layer (Pixel Definition Layer (PDL)) 27, a photo spacer (PS) layer 28, a first electrode layer 26, an organic functional layer 13 and a second electrode layer 29 that are stacked on a side of the base substrate 19.

The base substrate 19 may be of a rigid plate structure, such as a glass plate, a quartz plate, or an acrylic plate. The base substrate 19 includes a first surface and a second surface opposite to each other. Considering the orientation shown in FIG. 7 as an example, the first surface and the second surface are opposite surface placed horizontally, and in the vertical direction, the first surface is located above the second surface. That is, the first surface is an upper surface, and the second surface is a lower surface.

Herein, a direction perpendicular to the first surface of the base substrate 19 is defined as a stacking direction, and the stacking direction is parallel to a direction of the Z coordinate axis in FIG. 7.

It should be noted that, for convenience of the description, the structures herein will be described by taking the X coordinate axis, Y coordinate axis and Z coordinate axis marked in the drawings as a reference, but the X coordinate axis, Y coordinate axis and Z coordinate axis are not limited to three axes of the Cartesian coordinate system, which may be interpreted in a broader sense. For example, the X coordinate axis, the Y coordinate axis and the Z coordinate axis may be perpendicular to one another, or may represent different directions that are not perpendicular to one another.

The buffer layer 32 is disposed on the first surface of the base substrate 19, is an inorganic insulating film layer, may be made of a silicon-containing inorganic material, and may be a multi-layer or single-layer structure. The silicon-containing inorganic material may be at least one of silicon oxide ($SiO_2$), nitride silicon (SiNx) and silicon oxynitride (SiON). In this way, due to the properties of the inorganic material, the base substrate 19 and the structures on the base substrate 19 are insulated, thereby reducing or blocking external substances, moisture, or external air from penetrating from a bottom of the base substrate 19, and providing a flat surface.

The active layer 34 is disposed on a side of the buffer layer 32 away from the base substrate 19, and may be made of amorphous silicon (abbreviated as a-Si), polycrystalline silicon (abbreviated as Poly-Si), low-temperature polycrystalline silicon (LTPS), or metal oxides (such as Indium Gallium Zinc Oxide (IGZO)), or other materials.

The first gate insulating layer 20 is disposed on a side of the active layer 34 away from the base substrate 19, the gate metal layer 33 is disposed on a side of the first gate insulating layer 20 away from the base substrate 19, and the gate metal layer 33 includes gates of the TFTs and the scan signal lines 6 that are located in the display region 2. The active layer 34 includes channel regions corresponding to the gates.

The second gate insulating layer 21 is disposed on a side of the gate metal layer 33 away from the base substrate 19. The interlayer insulating layer 22 is disposed on a side of the second gate insulating layer away from the base substrate 19. The first source-drain metal layer 31 is disposed on a side of the interlayer insulating layer 22 away from the base substrate 19. The first planarization layer 23 and the passivation layer 24 are disposed on a side of the first source-drain metal layer 31 away from the base substrate 19. The second source-drain metal layer 30 is disposed on a side of the passivation layer 24 away from the base substrate 19.

The first source-drain metal layer 31 and the second source-drain metal layer 30 are metal layers at different heights. The sources and the drains of the TFTs, signal lines in the display substrate such as the data signal lines 7, the first voltage signal line, the second voltage signal line and the initialization voltage signal line, and electrode plates of the storage capacitors may be selectively arranged in the first source-drain metal layer 31 or the second source-drain metal layer 30. Some of the signal lines may also be arranged in both the first source-drain metal layer 31 and the second source-drain metal layer 30. By routing lines in different metal layers, resistances and coupling capacitances of the signal lines may be reduced, which is conducive to adapting to application scenarios with large size, high resolution, and high refresh rate.

In addition, the signal lines in the display substrate such as the data signal lines, the first voltage signal line, the second voltage signal line, and the initialization voltage signal line, and the electrode plates of the storage capacitors may be partially or completely arranged in the gate metal layer 33.

The second planarization layer 25 is disposed on a side of the second source-drain metal layer 30 away from the base substrate 19, and a surface of the second planarization layer 25 away from the base substrate 19 is a planar surface, which facilitates the production and molding of the structure on the planar surface.

It can be seen from the above that the active layer 34, the first gate insulating layer 20, the gate metal layer 33, the second gate insulating layer 21, the interlayer insulating layer 22, the first source-drain metal layer 31, the first planarization layer 23, the passivation layer 24, the second source-drain metal layer 30, and the second planarization layer 25, the pixel driving circuits 9 for driving the OLED light-emitting devices 10 may be formed, so that these layers are collectively referred to as a driving circuit layer. The driving circuit layer is a general term for the pixel driving circuits 9 of all the OLED sub-pixels 4 in the display substrate 1, and the base substrate 19 and the driving circuit layer are usually combined together and referred to as a backplane (BP).

The first electrode layer 26 is disposed on a side of the second planarization layer 25 away from the base substrate 19, and the first electrode layer 26 includes a plurality of anodes 14 located in the display region 2. The anodes 14 are connected to the driving circuit layer.

The pixel definition layer 27 is disposed on a side of the first electrode layer 26 away from the base substrate 19, and has pixel openings. The anodes 14 in the first electrode layer 26 are exposed by the pixel openings. The organic functional layer 13 is disposed in the pixel opening. The second electrode layer 29 is located on a side of the organic light-emitting layer away from the first electrode layer 26. The organic functional layer 13 located in the pixel opening and a portion of the first electrode layer 26 and a portion of the second electrode layer 29 that are located on two sides of the organic functional layer 13 form a single OLED light-emitting device 10.

The photo spacer layer 28 is disposed on a side of the pixel definition layer 27 away from the base substrate 19, and includes a plurality of display photo spacers 281 located in the display region 2. The display photo spacers 281 are columnar structures erected on the pixel defining layer 27, and the columnar structures are used to support a mask for evaporation.

In the above implementations, the first gate insulating layer 20, the second gate insulating layer 21, the interlayer insulating layer 22 and the passivation layer 24 are each an inorganic insulating film layer, which may be made of a silicon-containing inorganic material and may be a multi-layer or single-layer structure. The silicon-containing inorganic material may be at least one of silicon oxide ($SiO_2$), silicon nitride (SiNx), and silicon oxynitride (SiON).

Figure 8:
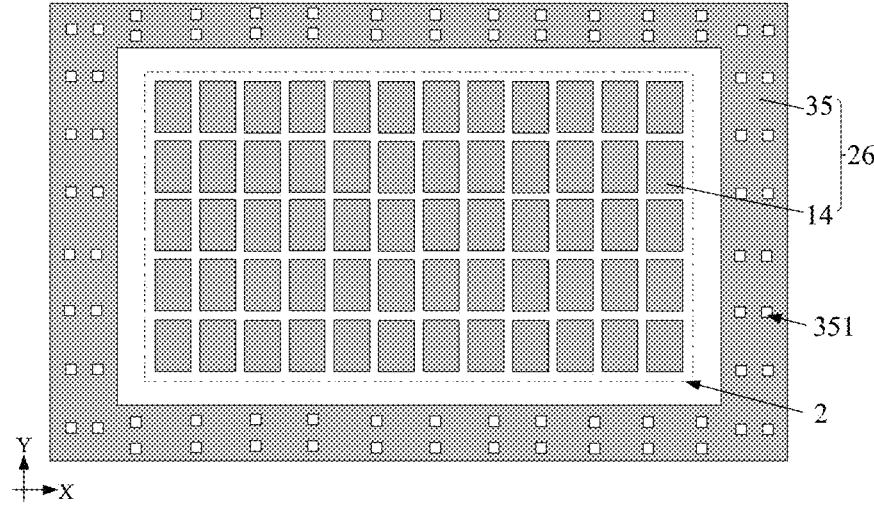
FIG. 8 is a structural diagram of a first electrode layer, in accordance with some embodiments.

FIG. 8 is a structural diagram of the first electrode layer, in accordance with some embodiments. As shown in FIG. 8, the first electrode layer 26 includes the plurality of anodes 14 located in the display region 2, and the plurality of anodes 14 and the OLED sub-pixels 4 in the display region 2 are in one-to-one correspondence. The first electrode layer 26 further includes a transfer portion 35 located in the non-display region 3, and the transfer portion 35 is insulated from the plurality of anodes 14 in the display region 2. The transfer portion 35 is provided therein with a plurality of through holes 351, and the through holes 351 are used for exhausting gas during the process.

Figure 9:
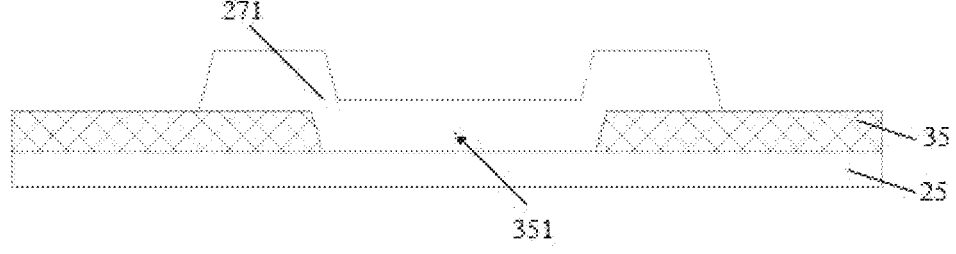
FIG. 9 is a sectional view of a transfer portion at a position of a through hole, in accordance with some embodiments.

As shown in FIG. 9, the display substrate 1 further includes filling portions 271 for filling the through holes 351, and the filling portions 271 cover edges of the through holes 351, thereby avoiding lateral erosion of the through holes 351 by the chemical solution during the manufacturing process. In some embodiments, the filling portions 271 are arranged in the same layer as the pixel definition layer 27. That is, portions of the pixel definition layer 27 are used as the filling portions 271 for filling the through holes 351.

Figure 10:
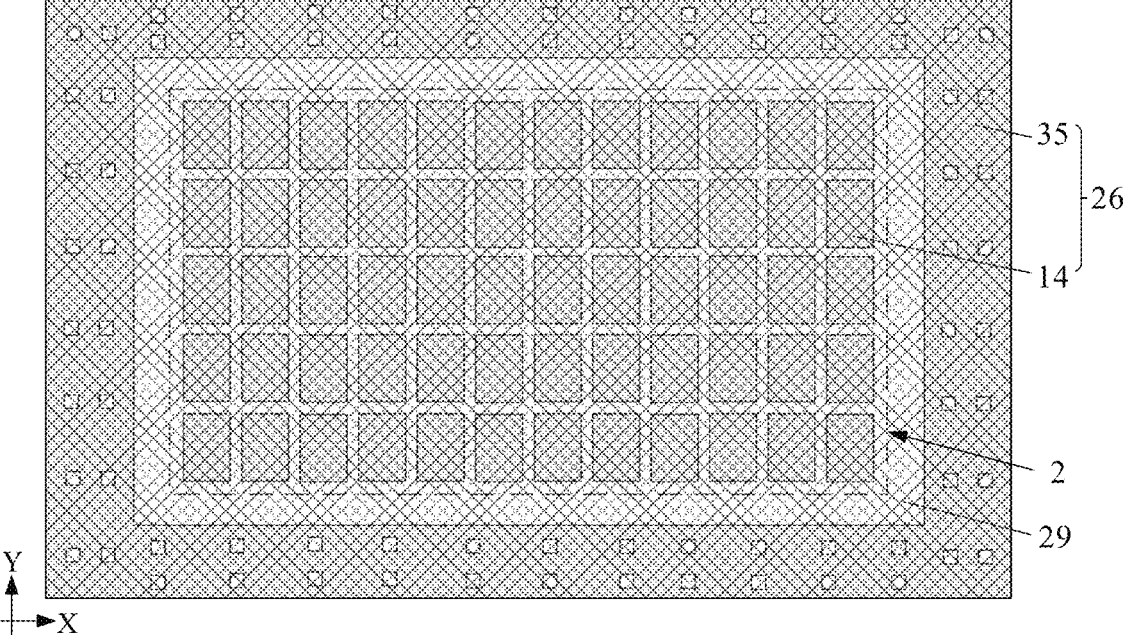
FIG. 10 is a diagram showing a second electrode layer overlapping with a first electrode layer, in accordance with some embodiments.

FIG. 10 is a diagram showing the second electrode layer overlapping with the first electrode layer, in accordance with some embodiments. Referring to FIG. 10, the second electrode layer 29 covers the display region 2 and is used as a common electrode for the OLED sub-pixels 4 in the display region 2. A portion of the second electrode layer 29 corresponding to an OLED sub-pixel 4 is a cathode 12 of an OLED light-emitting device 10 in the OLED sub-pixel 4. The second electrode layer 29 extends outward from the display region 2 to a position of the transfer portion 35, and contacts with the transfer portion 35 to achieve overlapping.

Figure 11:
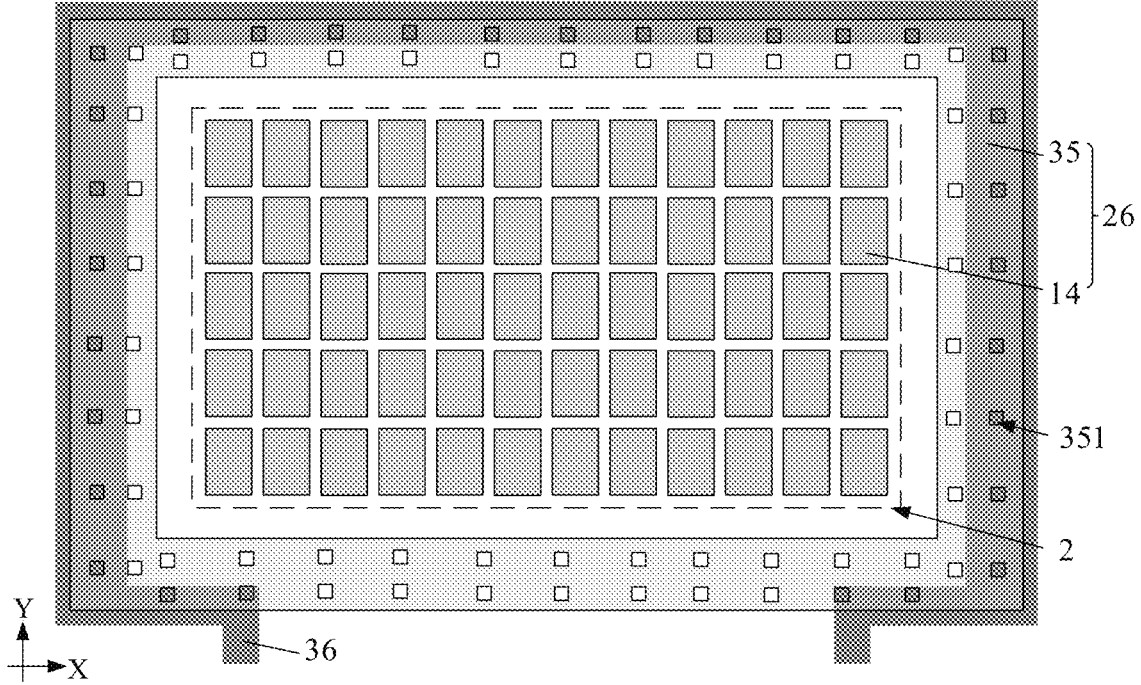
FIG. 11 is a structural diagram of a transfer portion and a first voltage signal line, in accordance with some embodiments.

FIG. 11 is a structural diagram of the transfer portion and the first voltage signal line, in accordance with some embodiments. As shown in FIG. 11, the display substrate 1 includes the first voltage signal line 36, and the transfer portion 35 is connected to the first voltage signal line 36, the first voltage signal line 36 is configured to output the VSS voltage signal to the display region 2.

In this way, the display substrate 1 may output, through the first voltage signal line 36, the transfer portion 35 and the second electrode layer 29, the VSS voltage signal to the display region 2, i.e., the cathode signal to the cathodes 12 of the OLED light-emitting devices 10.

It will be noted that the transfer portion 35 used to transfer the VSS voltage signal to the second electrode layer 29 may be arranged in the same layer as the first electrode layer 26, or may be arranged in the same layer as other metal layer. For example, the transfer portion 35 may be arranged in the same layer as the source-drain metal layer.

Figure 12:
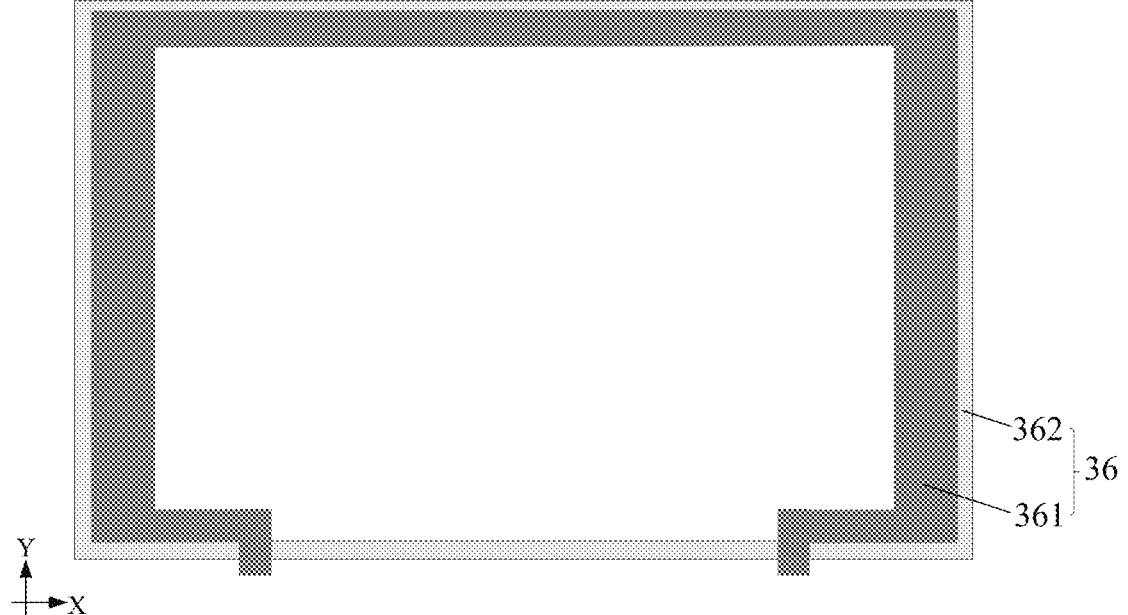
FIG. 12 is a structural diagram of a first voltage signal line, in accordance with some embodiments.

FIG. 12 is a structural diagram of the first voltage signal line, in accordance with some embodiments. As shown in FIG. 12, in some embodiments, the first voltage signal line 36 includes a first trace portion 361 and a second trace portion 362, and the first trace portion 361 and the second trace portion 362 are located in different layers. In this way, the line resistance is reduced through a double-layer routing manner, thereby achieving the technical effect of reducing the voltage drop of the first voltage signal line 36.

For example, the first voltage signal line 36 includes the first trace portion 361 located in the first source-drain metal layer 31 and the second trace portion 362 located in the gate metal layer 33. A resistance of the first source-drain metal layer 31 is one tenth ($\frac{1}{10}$) of a resistance of the gate metal layer 33. Therefore, when the first trace portion 361 and the second trace portion 362 are arranged side by side, the line resistance may be reduced, which achieves the technical effect of reducing the voltage drop.

Figure 13:
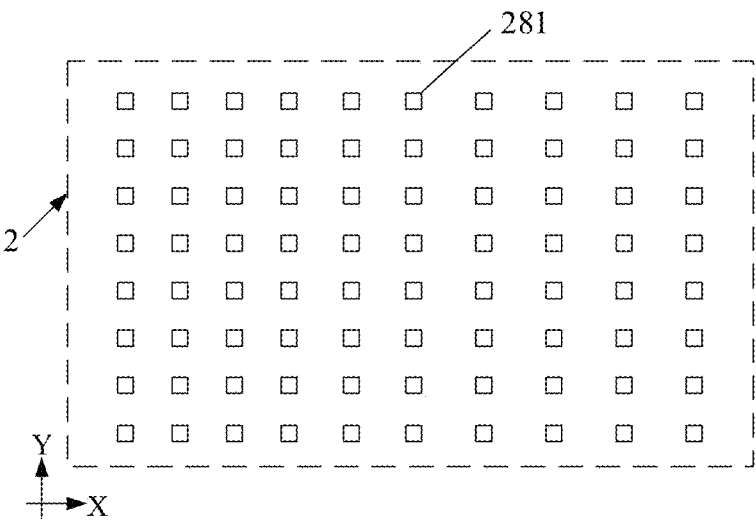
FIG. 13 is a structural diagram of display photo spacers in a display region, in accordance with some embodiments.

FIG. 13 is a structural diagram of display photo spacers 281 in the display region, in accordance with some embodiments. As shown in FIG. 13, a display photo spacer 281 in the display region 2 is located on a side of a pixel opening, i.e., beside an OLED light-emitting device 10. The plurality of display photo spacers 281 are arranged in rows in the pixel row direction and arranged in columns in the pixel column direction.

Figure 15:
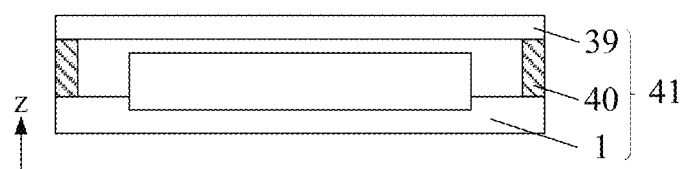
FIG. 15 is a diagram showing a stacked structure of a display panel, in accordance with some embodiments.

Some embodiments of the present disclosure provide a display panel. As shown in FIG. 15, the display panel 41 includes the display substrate 1, an encapsulation adhesive 40, and a protective cover plate 39. The encapsulation adhesive 40 and the protective cover plate 39 are disposed on a display side of the display substrate 1. The display side is a side to which a display direction of the display substrate points. Considering the implementation shown in FIG. 7 as an example, the encapsulation adhesive 40 and the protective cover plate 39 are disposed on a side of the second electrode layer 29 away from the base substrate 19.

The protective cover plate 39 is a transparent rigid plate, such as a glass plate, a quartz plate, or a plastic plate, and is used to encapsulate and protect the display substrate 1. The encapsulation adhesive 40 is disposed between the protective cover plate 39 and the display substrate 1, and is used to connect the protective cover plate 39 and the display substrate 1. The protective cover plate 39 is encapsulated on the display substrate 1 through the encapsulation adhesive 40.

Figure 14:
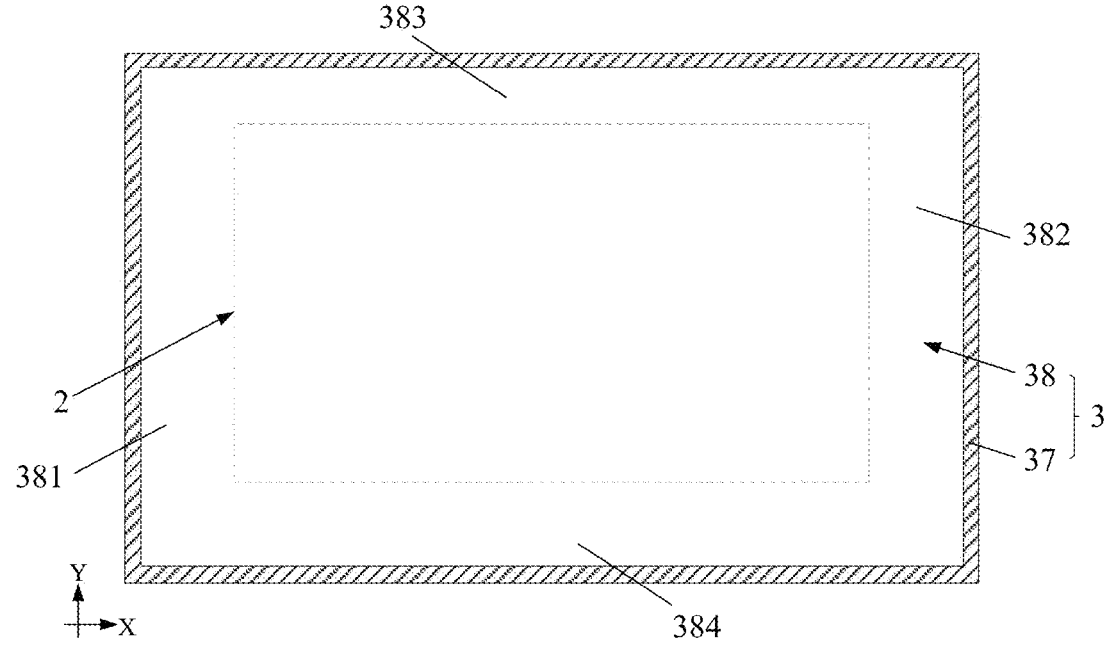
FIG. 14 is a front view of a display substrate, in accordance with some embodiments.

As shown in FIG. 14, the non-display region 3 of the display substrate 1 includes an encapsulation region 37 and a peripheral region 38. The encapsulation region 37 is a region for arranging the encapsulation adhesive 40. The display substrate 1 and the protective cover plate 39 are connected through the encapsulation adhesive 40 in the encapsulation region 37, so as to realize the encapsulation of the protective cover plate 39.

In order to ensure the encapsulation effect of the encapsulation adhesive 40 on the OLED light-emitting devices 10 in the entire display region 2, the encapsulation region 37 is designed as a closed ring-shaped region surrounding the display region 2, and the encapsulation adhesive 40 disposed in the encapsulation region 37 is also a closed ring-shaped adhesive.

In the display substrate 1, a region between the display region 2 and the encapsulation region 37 is the peripheral region 38, and the peripheral region 38 is also a closed ring-shaped region surrounding the display region 2. The peripheral region 38 may be divided into different regions according to different relative positions of the peripheral region 38 and the display region 2.

Contours of the display substrate 1 and the display region 2 may be square, circular, elliptical, or other regular or irregular shapes. Correspondingly, shapes of the encapsulation region 37 and the peripheral region 38 match the contours of the display substrate 1 and the display region 2.

In the implementation shown in FIG. 14, the contour of the display substrate 1 is a first rectangle, the contour of the display region 2 is a second rectangle, the first rectangle surrounds the second rectangle, and a long side of the first rectangle is parallel to a long side of the second rectangle. The peripheral region 38 and the encapsulation region 37 are each a rectangular frame with a certain width.

In this embodiment, the long side of the first rectangle and the long side of the second rectangle are both parallel to the pixel row direction, that is, parallel to the extending direction of the scan signal lines 6. A short side of the first rectangle and a short side of the second rectangle are both parallel to the pixel column direction, that is, parallel to the extending direction of the data signal lines 7.

The peripheral region 38 of the display substrate 1 has a first region 381 and a second region 382 respectively disposed on two sides of the display region 2 in the pixel row direction. The peripheral region 38 of the display substrate 1 includes a third region 383 and the fourth region 384 respectively disposed on two sides of the display region 2 in the pixel column direction.

It can be seen from the above description that the extending direction of the scan signal lines 6 is parallel to the pixel row direction, and the extending direction of the data signal lines 7 is parallel to the pixel column direction. That is to say, the first region 381 and the second region 382 are portions of the peripheral region 38 respectively disposed on the two sides of the display region 2 in the extending direction of the scan signal lines 6, and the third region 383 and the fourth region 384 are portions of the peripheral region 38 respectively disposed on the two sides of the display region 2 in the extending direction of the data signal lines 7.

Considering the orientation shown in FIG. 14 as an example, the pixel row direction, the extending direction of the scan signal lines 6, a direction of the long side of the first rectangle, and a direction of the long side of the second rectangle are the same as the horizontal direction, and are parallel to the X coordinate axis in FIG. 14. The first region 381 and the second region 382 are the portions of the peripheral region 38 located on the left and right sides of the display region 2, the first region 381 is located on the left side of the display region 2, and the second region 382 is located on the right side of the display region 2. That is, the first region 381 is a left frame region, and the second region 382 is a right frame region.

The pixel column direction, the extending direction of the data signal lines 7, a direction of the short side of the first rectangle, and a direction of the short side of the second rectangle are the same as the vertical direction, and are parallel to the Y coordinate axis in FIG. 14. The third region 383 and the fourth region 384 are the portions of the peripheral region 38 located on the upper and lower sides of the display region 2, the third region 383 is located on the upper side of the display region 2, and the fourth region 384 is located on the lower side of the display region 2. That is, the third region 383 is a upper frame region, and the fourth region 384 is a lower frame region.

The display substrate 1 is usually provided therein with a scan driving circuit 15 in the first region and/or the second region 382. In the implementation in which the scan driving circuit 15 is a GOA circuit 18, the GOA circuit 18 may be disposed on a single side of the display region 2, i.e., only disposed in the first region 381 or the second region 382.

In the implementation where the GOA circuit 18 has the scan signal control circuit 183, the light-emitting signal control circuit 181 and the reset signal control circuit 182, the scan signal control circuit 183, the reset signal control circuit 182 and the light-emitting signal control circuit 181 in the GOA circuit 18 are arranged in the first region 381 or the second region 382 in the direction of the scan signal lines 6, and the arrangement order is arbitrary. For example, the scan signal control circuit 183, the reset signal control circuit 182 and the light-emitting signal control circuit 181 are sequentially arranged in a direction away from the display region 2, and the scan signal control circuit 183 is close to the border of the display region 2.

In the implementation where the GOA circuit 18 has the scan signal control circuit 183 and the light-emitting signal control circuit 181, the scan signal control circuit 183 and the light-emitting signal control circuit 181 are arranged in the first region 381 or the second region 382, and the arrangement order is arbitrary. For example, the scan signal control circuit 183 and the light-emitting signal control circuit 181 are sequentially arranged in the direction away from the display region 2, and the scan signal control circuit 183 is close to the border of the display region 2.

In some possible embodiments, the GOA circuits 18 may be disposed on two sides of the display region 2, i.e., disposed in the first region 381 and the second region 382. For example, the first region 381 is provided therein with a first GOA circuit 18 for driving a part of the pixel rows 8, and the second region 382 is provided therein with a second GOA circuit 18 for driving the remaining part of the pixel rows 8. For example, the first GOA circuit 18 is used to drive even-numbered pixel rows 8, and the second GOA circuit 18 is used to drive odd-numbered pixel rows 8. As for the arrangement of the first GOA circuit 18 and the second GOA circuit 18, reference may be made to the arrangement of the single-side arrangement described above, and details will not be repeated here.

For another example, different functional parts of the GOA circuit 18 are respectively arranged in the first region 381 and the second region 382. For example, in the implementation where the GOA circuit 18 includes the scan signal control circuit 183 and the light-emitting signal control circuit 181, one of the scan signal control circuit 183 and the light-emitting signal control circuit 181 may be disposed in the first region 381, and the other may be disposed in the second region 382.

Figure 16:
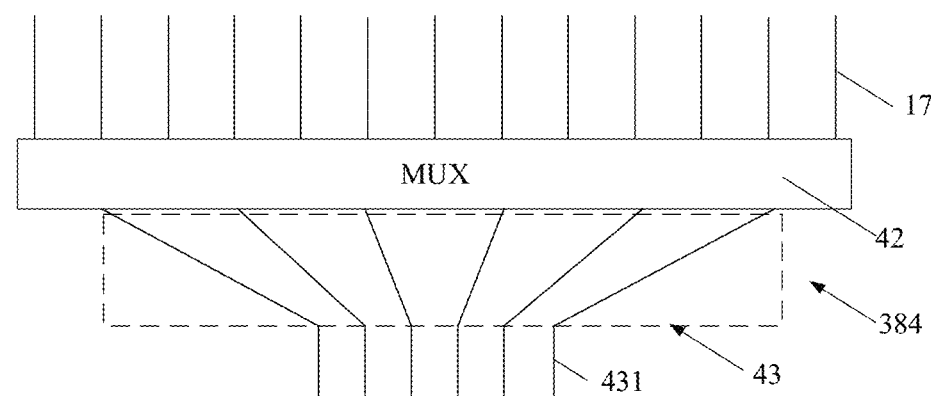
FIG. 16 is a diagram showing a structure of a display substrate in a fourth region, in accordance with some embodiments.

Referring to FIG. 16, in some embodiments of the present disclosure, the display substrate 1 is provided with a fan-out region 43 in the fourth region 384. The data signal lines 7 in the display region 2 extend to the fourth region 384, i.e., the lower frame region, and pass through the fan-out region 43 and then are connected to the data driving circuit 17 at a position outside the encapsulation region 37.

The data driving circuit 17 usually adopts an integrated circuit chip bonded to the display substrate 1. However, the number of pins of the data driving circuit 17 that can connect to the data signal lines 7 is limited. Thus, in some embodiments, the display substrate 1 includes a time-sharing multiplex circuit 42 disposed in the fourth region 384, and the display substrate 1 has the fan-out region 43 on a side of the time-sharing multiplex circuit 42 away from the display region 2.

The time-sharing multiplex circuit 42 includes a plurality of multiplexers (MUXs). The multiplexer usually has one input terminal and at least two output terminals, and the input terminals of the multiplexers are connected to intermediate traces 431, and the intermediate traces 431 extend through the fan-out region 43 and are connected to the data driving circuit 17 at the position outside the encapsulation region 37. The at least two output terminals of the multiplexer are respectively connected to data signal lines 7. The multiplexer transmits a data power supply signal output by one output terminal of the data driving circuit 17 to the data signal lines 7 in a time-sharing manner.

In a possible implementation, the data signal lines 7 may be led out to the upper side of the display region 2, and the fan-out region 43 and the time-sharing multiplex circuit 42 are correspondingly arranged in the third region 383, that is, arranged in the upper frame region.

Figure 17:
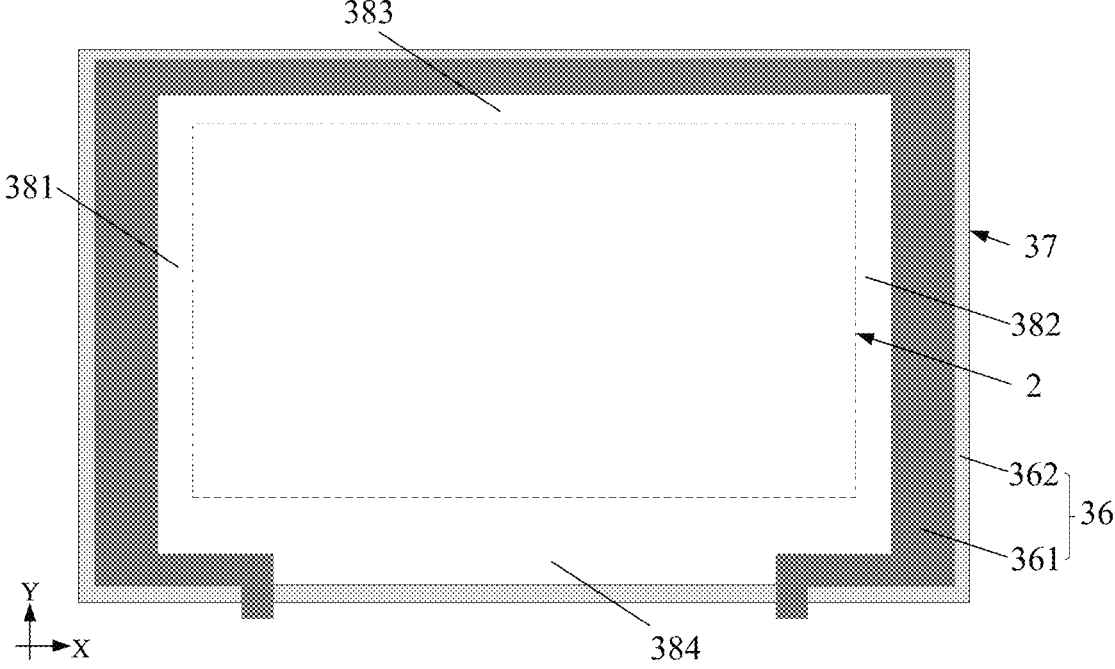
FIG. 17 is a diagram showing a relationship between a first voltage signal line and an encapsulation region, in accordance with some embodiments.

FIG. 17 is a diagram showing a relationship between the first voltage signal line and the encapsulation region, in accordance with some embodiments. As shown in FIG. 17, the display substrate 1 includes the first voltage signal line 36 in the peripheral region 38 configured to provide the VSS signal to the display region 2. The first voltage signal line 36 extends around the peripheral of the display region 2 in the first region 381, the third region 383 and the second region 382, and two ends of the first voltage signal line 36 extend to the fourth region 384. The power supply circuit 16 is connected to the two ends of the first voltage signal line 36.

In the peripheral region 38 with the GOA circuit 18, that is, the first region 381 and/or the second region 382, the first voltage signal line 36 is farther away from the display region 2 relative to the GOA circuit 18, and is located on an outside of the GOA circuit 18 relative to the display region 2.

In some embodiments, the first voltage signal line 36 includes the first trace portion 361 and the second trace portion 362, and the first trace portion 361 and the second trace portion 362 are located in different layers. An orthographic projection of the first trace portion 361 on the base substrate 19 is located between the encapsulation region 37 and the display region 2, and an orthographic projection of the second trace portion 362 on the base substrate 19 is at least partially located in the encapsulation region 37.

It can be seen from the above description that the protective cover plate 39 is encapsulated on the display substrate 1 by the encapsulation adhesive 40 disposed in the encapsulation region 37. In this embodiment, the display panel 41 adopts a Frit (glass glue) encapsulation manner, that is, through the glass glue (Frit Seal) arranged in the encapsulation region 37, the protective cover plate 39 and the display substrate 1 are encapsulated after the glass glue is melted and solidified. The Frit encapsulation manner has the advantages of no need for groove, good water and oxygen blocking ability, and simple process.

The encapsulation adhesive 40 is a colloid structure extending in a closed contour. For example, the encapsulation adhesive 40 may be a square frame glue. Due to the support of the encapsulation adhesive 40, a certain gap exists between the display substrate 1 and the protective cover plate 39 in the display direction of the display panel 41. The gap between the display substrate 1 and the protective cover plate 39 caused by the support of the encapsulation adhesive 40 is an encapsulation gap.

It will be understood that a size of the encapsulation gap is related to a thickness of the encapsulation adhesive 40. The encapsulation adhesive 40 with a large thickness may cause a large encapsulation gap, and the encapsulation adhesive 40 with a small thickness may cause a small encapsulation gap.

Herein, a space surrounded by the encapsulation adhesive 40 between the display substrate 1 and the protective cover plate 39 is defined as an encapsulation adhesive space, and the encapsulation adhesive space is filled with air, such as nitrogen ($N_2$), to form an air film with a thickness. The thickness of the air film is equal to a size of the encapsulation gap at a position where the air film is located.

In the related art, a protective cover plate 39 generally has a certain rigidity requirement. Therefore, due to the influence of factors such as the material and structure, in the natural state or under action of the external force, the protective cover plate 39 may, for example, undergo the external force, such as touch pressing or accidental squeezing, the protective cover plate 39 is prone to be deformed toward a display substrate 1 under the action of the external force, and the thickness of the air film between the deformed protective cover plate 39 and the display substrate 1 becomes smaller or even zero.

When the protective cover plate 39 is deformed toward the display substrate 1 and the deformation range reaches a certain level, for example, when the protective cover plate 39 is in contact with the display substrate 1, colored Newton's rings, i.e., a rainbow pattern defect, will be generated at the contact position, and a center of the colored Newton's rings is the contact position.

The Newton's rings phenomenon is a thin film interference phenomenon. The thin film interference refers to the phenomenon that if a light wave is irradiated on a thin film, the light wave will be reflected by an upper interface and a lower interface of the thin film due to different refractive indexes, and a new light wave will be generated due to mutual interference.

The Newton's rings phenomenon belongs to the equal thickness interference phenomenon in the thin film interference, and the interference pattern is a series of concentric circular rings consisting of bright and dark fringes. For example, if a convex surface of a convex lens with a large radius of curvature is in contact with a plane glass, under the irradiation of sunlight or white light, it may be seen that a contact point in the interference pattern is a dark point surrounded by a series of bright and dark colored circular rings; and under the irradiation of monochromatic light, the interference pattern appears as a series of light and dark monochromatic circular rings. The circular rings (colored circular rings or monochromatic circular rings) in Newton's rings are interference circular rings formed by the mutual interference of light beams. A sequence of the interference circular rings relative to the center of the circle is an order of the interference circular rings. For the colored circular rings, colored circular rings of different orders in the interference pattern have different colors.

In common application scenarios of the display panel 41 in the related art, it is usually used under daylight and white light, so that the Newton's rings are colored Newton's rings.

Figure 18:
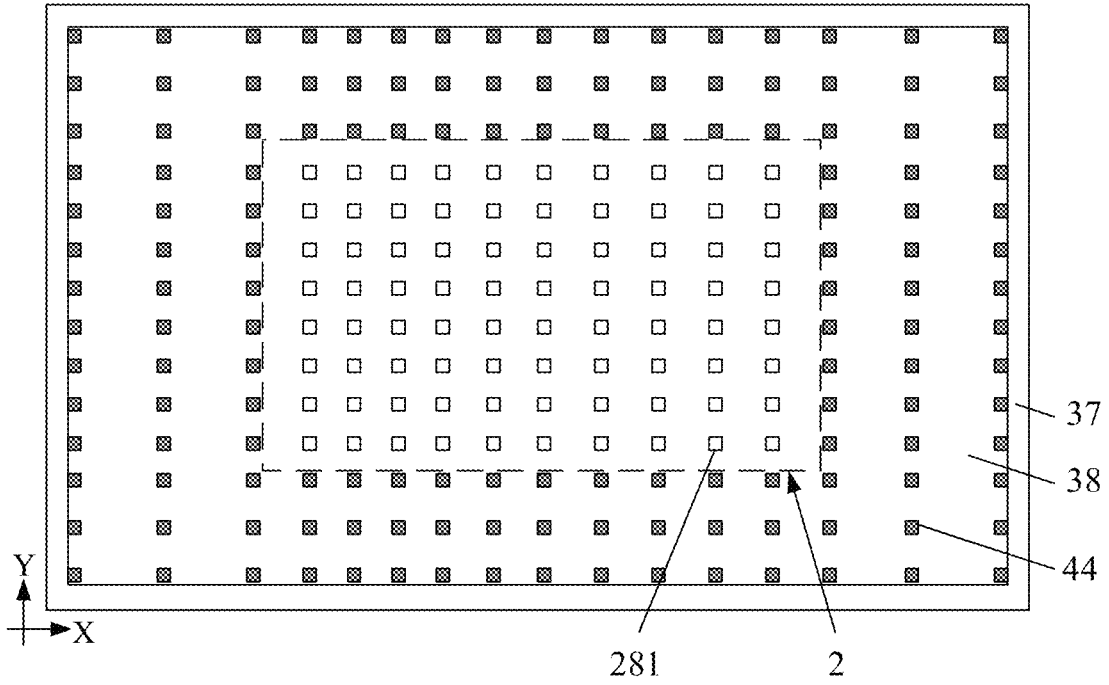
FIG. 18 is a diagram showing a distribution of peripheral photo spacers, in accordance with some embodiments.

In light of this, the embodiments of the present disclosure provide the display substrate. Referring to FIG. 18, the display substrate 1 includes a plurality of peripheral photo spacers 44 disposed in the peripheral region 38, and the plurality of peripheral photo spacers 44 are used to support the protective cover plate 39 during the encapsulation of the display substrate 1 and the protective cover plate 39. That is to say, orthographic projections of the plurality of peripheral photo spacers 44 on the base substrate overlaps with an orthographic projection of the protective cover plate 39 on the base substrate.

A direction perpendicular to a border of the display region 2 adjacent to the plurality of peripheral photo spacers 44 is defined as a first direction. In the first direction, a distance from a peripheral photo spacer of the plurality of peripheral photo spacers 44 closest to the encapsulation region 37 to the encapsulation region 37 is a first distance, and a distance from the peripheral photo spacer of the plurality of peripheral photo spacers 44 closest to the encapsulation region 37 to the display region 2 is a second distance. The first distance is less than or equal to the second distance.

That is to say, a ratio of the first distance to a width of the peripheral region 38 is in a range from 0 to 0.5, e.g., in a range from 0 to 0.2, a range from 0.2 to 0.4, or a range from 0.4 to 0.5, such as 0, 0.05, 0.1, 0.15, 0.2, 0.25, 0.3, 0.35, 0.4, 0.45 and 0.5.

In this way, among the plurality of peripheral photo spacers 44 in the peripheral region 38, the peripheral photo spacer 44 closest to the encapsulation region 37 is arranged closer to the border of the encapsulation region 37. It should be noted that when the ratio of the first distance to the width of the peripheral region 38 is 0, that is, when the first distance is 0, the peripheral photo spacer 44 closest to the encapsulation region 37 is in contact with the encapsulation region 37.

In this way, in the display substrate 1 provided in the embodiments of the present disclosure, by providing the peripheral photo spacers 44, it may be possible to improve the support effect of the display substrate 1 on the protective cover plate 39 when the display substrate 1 is encapsulated on the protective cover plate 39, and to avoid the deformation of the protective cover plate 39 at the arrangement positions of the peripheral photo spacers 44. Therefore, the Newton's rings (rainbow pattern defect) may be ameliorated or even eliminated, so as to improve the display quality of the display panel 41 including the display substrate 1.

In addition, among the plurality of peripheral photo spacers 44 in the peripheral region 38, the peripheral photo spacer 44 closest to the encapsulation region 37 is arranged closer to the border of the encapsulation region 37. In this way, even if the Newton's rings occur, a position where the the Newton's rings occur will be close to the encapsulation region 37 and away from the display region 2. Therefore, the influence of the Newton's rings on the display effect of the display region 2 is ameliorated or even eliminated, and the display quality of the display panel 41 including the display substrate 1 is improved.

In some embodiments of the present disclosure, the peripheral photo spacers 44 are columnar structures erected on the display substrate 1. The columnar structure may have a regular or irregular three-dimensional shape, for example, a cylinder, a tapered column, or a square column. The peripheral photo spacers 44 may be arranged in the same layer as the display photo spacers 281, or may be formed by patterning a single organic layer.

It should be noted that, the term of "erected on the display substrate 1" here means that an extending direction of the peripheral photo spacers 44 is perpendicular or substantially perpendicular to the base substrate 19 in the display substrate 1, that is, parallel or substantially parallel to the stacking direction (the direction of the Z coordinate axis in FIG. 7) described above.

In order to enable the peripheral photo spacers 44 to support the protective cover plate 39 during the encapsulation of the display substrate 1 and the protective cover plate 39, surfaces of the peripheral photo spacers 44 away from the base substrate 19 and a surface of the encapsulation adhesive 40 away from the base substrate 19 are flush or approximately flush. Herein, in the stacking direction perpendicular to the base substrate 19 in the display substrate 1, a distance between the surface of the peripheral photo spacer 44 away from the base substrate 19 and the base substrate 19 is defined as a first height, and a distance between the surface of the encapsulation adhesive 40 away from the base substrate 19 and the base substrate 19 is defined as a second height. The surface of the peripheral photo spacer 44 away from the base substrate 19 and the surface of the encapsulation adhesive 40 away from the base substrate 19 are flush, which means that the first height and the second height are equal. The surface of the peripheral photo spacer 44 away from the base substrate 19 and the surface of the encapsulation adhesive 40 away from the base substrate 19 are approximately flush, which means that the first height and the second height are not equal but have a small difference. Due to the small difference, even if the protective cover plate 39 is deformed, the colored Newton's rings will not occur.

It should further be noted that the second electrode layer 29 is disposed on the surfaces of the peripheral photo spacers 44 away from the base substrate 19, and the peripheral photo spacers 44 support the second electrode layer 29 in contact with the protective cover plate 39. Normally, the thickness of the second electrode layer 29 is small, which may be ignored when comparing with the height of the peripheral photo spacer 44. However, in a scenario where the thickness of the second electrode layer 29 needs to be considered, the limitation on the height of the peripheral photo spacer 44 should be understood as the limitation on a sum of the thickness of the peripheral photo spacer 44 and the thickness of the second electrode layer 29.

In order to facilitate the description of the distribution of the plurality of peripheral photo spacers 44 in the peripheral region 38, herein, the direction perpendicular to the border of the display region 2 adjacent to the plurality of peripheral photo spacers 44 is defined as the first direction, and the direction parallel to the border of the display region 2 adjacent to the plurality of peripheral photo spacers 44 is defined as the second direction. The first direction and the second direction at the same position of the peripheral region 38 are perpendicular to each other. The first direction varies at different positions of the peripheral region 38. When the first direction varies, the second direction also varies.

For example, in the embodiment shown in FIG. 14, in the first region 381 and the second region 382 of the peripheral region 38, the first direction extends horizontally and is parallel to the direction of the X coordinate axis in FIG. 14, the second direction extends vertically and is parallel to the direction of the Y coordinate axis in FIG. 14.

In the third region 383 and the fourth region 384 of the peripheral region 38, the first direction extends vertically and is parallel to the direction of the Y coordinate axis in FIG. 14, and the second direction extends horizontally and is parallel to the direction of the X coordinate axis in FIG. 14.

For another example, the shape of the border of the display region 2 is circular, and the border of the peripheral region 38 is in a shape of a ring concentric with the display region 2. The first direction at different positions of the peripheral region 38 is a radial direction of the circular display region 2. The second direction at different positions of the peripheral region 38 is perpendicular to the first direction, i.e., a direction of a tangent line of the circular display region 2 at a corresponding position.

In some embodiments of the present disclosure, the plurality of peripheral photo spacers 44 in the peripheral region 38 are arranged at a plurality of different positions in the first direction and a plurality of different positions in the second direction. Since the peripheral photo spacers 44 are arranged at the plurality of different positions in the first direction and the plurality of different positions in the second direction, the purpose of supporting the protective cover plate 39 at different positions in the peripheral region 38 may be realized. Therefore, it may ensure that the effect of Newton's rings at a plurality of positions in the peripheral region 38 may be ameliorated or even eliminated.

It will be understood that the more the plurality of peripheral photo spacers 44 arranged in the peripheral region 38, the larger the range of the arrangement region, the larger the support region of the protective cover plate 39, the better the support effect, and the greater the improvement degree of the Newton's rings.

For example, the plurality of peripheral photo spacers 44 are arranged in rows and columns in the third direction and the fourth direction, and the third direction is perpendicular to the fourth direction. The third direction may be parallel to the first direction. In a case where the first direction is parallel to the third direction, the fourth direction is also parallel to the second direction. According to the above description, the first direction may be different at different positions of the peripheral region 38. Therefore, a row direction and a column direction of the row and column arrangement of the plurality of peripheral photo spacers 44 may also be different at different positions of the peripheral region 38.

In an implementation where the first direction changes at different positions, the third direction and the fourth direction may be respectively parallel to a first direction and a second direction at a certain location. That is, in the peripheral region 38, the row direction and the column direction of the row and column arrangement of the plurality of peripheral photo spacers 44 stay consistent.

For example, referring to FIG. 18, the row direction and the column direction of the row and column arrangement of the plurality of peripheral photo spacers 44 in the peripheral region 38 are the same as the row direction and column direction of the plurality of display photo spacers 281 in the display region 2 respectively, and are respectively parallel to the pixel row direction and the pixel column direction in the display region 2.

In some embodiments of the present disclosure, adjacent rows and/or adjacent columns of the plurality of peripheral photo spacers 44 arranged in rows and columns may be staggered, and through the staggered arrangement, the support effect of the peripheral photo spacers 44 on the protective cover plate 39 may be effectively improved.

In some embodiments of the present disclosure, the row direction and the column direction of the plurality of display photo spacers 281 arranged in rows and columns are the same as the row direction and the column direction of the plurality of peripheral photo spacers 44 arranged in rows and columns, respectively. At least one row of peripheral photo spacers 44 and one row of display photo spacers 281 are located in the same straight line, and the number of the rows of the display photo spacers 281 is greater than the number of the rows of the peripheral photo spacers 44.

And/or, at least one column of peripheral photo spacers 44 and one column of display photo spacers 281 are located in the same straight line, and the number of the columns of the display photo spacers 281 is greater than the number of the columns of the peripheral photo spacers 44.

In some embodiments of the present disclosure, the plurality of display photo spacers 281 are arranged in rows and columns, the plurality of peripheral photo spacers 44 are arranged in rows and columns, and a row of peripheral photo spacers 44 and a row of display photo spacers 281 constitute a photo spacer row. In the photo spacer row, a distance between at least some adjacent peripheral photo spacers 44 is equal to a distance between adjacent display photo spacers 281.

And/or, a column of peripheral photo spacers 44 and a column of display photo spacers 281 constitute a spacer row. In the spacer row, a distance between at least some adjacent peripheral photo spacers 44 is equal to a distance between adjacent display photo spacers 281.

Figure 19:
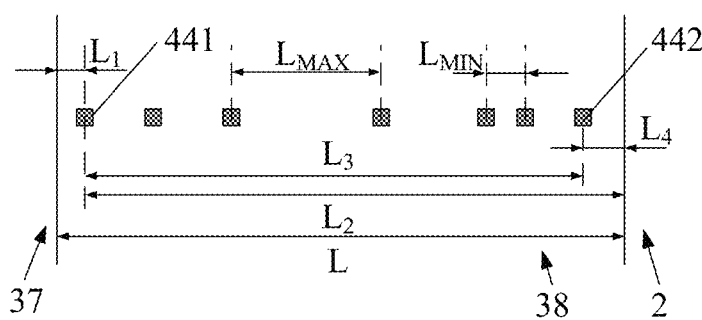
FIG. 19 is a diagram showing a distribution of peripheral photo spacers in a first direction, in accordance with some embodiments.

Referring to FIG. 19, for convenience of the description, herein, in the first direction, among the plurality of peripheral photo spacers 44, a peripheral photo spacer 44 closest to the encapsulation region 37 is defined as a first peripheral photo spacer 441, and a peripheral photo spacer 44 closest to the display region 2 is defined as a second peripheral photo spacer 442. A distance between the first peripheral photo spacer 441 and the border of the encapsulation region 37 in the first direction is the first distance, and the first distance is represented by $L_1$. A distance between the first peripheral photo spacer 441 and the border of the display region 2 in the first direction is the second distance, and the second distance is represented by $L_2$.

A distance between the second peripheral photo spacer 442 and the first peripheral photo spacer 441 in the first direction is defined as a third distance, and the third distance is represented by $L_3$. A distance between the second peripheral photo spacer 442 and the border of the display region 2 in the first direction is defined as a fourth distance, and the fourth distance is represented by $L_4$.

A largest distance between two adjacent peripheral photo spacers 44 in the first direction is defined as a maximum distance, and the maximum distance is represented by $L_{MAX}$. A smallest distance between two adjacent peripheral photo spacers 44 in the first direction is defined as a minimum distance, and the minimum distance is represented by $L_{MIN}$. In addition, in the first direction, a distance between two outer edges of the peripheral region 38 is a width of the peripheral region 38, and L is used to represent the width of the peripheral region 38.

By restricting the relationship between the first distance $L_1$, the second distance $L_2$, the third distance $L_3$, the fourth distance $L_4$ and the width L of the peripheral region 38, it may be possible to represent the position of the distribution region of the plurality of peripheral photo spacers 44 in the peripheral region 38 relative to the border of the display region 2 and the border of the encapsulation region 37.

In some embodiments of the present disclosure, a ratio of the first distance $L_1$ to the width L of the peripheral region 38 is in a range from 0 to 0.2. That is, the distance of the first peripheral photo spacer 44 among the plurality of peripheral photo spacers 44 closest to the border of the encapsulation region 37 to the border of the encapsulation region 37 in the first direction is 0% to 20% of the width of the peripheral region 38. For example, the ratio is in a range from 0 to 0.08, a range from 0.08 to 0.16, or a range from 0.16 to 0.2, such as 0, 0.02, 0.04, 0.06, 0.08, 0.1, 0.12, 0.14, 0.16, 0.18, or 0.2.

Therefore, it can be seen that, in the first direction, among the plurality of peripheral photo spacers 44, the first peripheral photo spacer 441 closest to the border of the encapsulation region 37 is at a position close to the encapsulation region 37. In this way, it may be possible to effectively support the protective cover plate 39 at the position close to the encapsulation region 37, which may ameliorate or even eliminate the Newton's rings, and in turn improve the display quality of the display panel 41 including the display substrate 1.

In addition, even if the Newton's rings occur, the position where the Newton's rings occur will move to a position close to the encapsulation region 37, i.e., a position away from the display region 2. Thus, the influence of the Newton's rings on the display effect in the display region 2 is ameliorated or even eliminated, so as to improve the display quality of the display panel 41 including the display substrate 1.

In a case where the ratio of the first distance $L_1$ to the width L of the peripheral region 38 is 0 or close to 0, the first peripheral photo spacer 441 is located at an edge of the encapsulation region 37 proximate to the periphery region 38, or is located at a position close to the encapsulation region 37. In this way, it may be possible to effectively support the protective cover plate 39 at the edge of the encapsulation region 37 proximate to the periphery region 38 or the position close to the encapsulation region 37, which may avoid the existence of the Newton's rings between the plurality of peripheral photo spacers 44 and the encapsulation region 37, and in turn improve the display quality of the display panel 41 including the display substrate 1.

In some embodiments of the present disclosure, the first distance $L_1$ is approximately equal to the fourth distance $L_4$. It should be noted that the term of approximately equal should be understood that the ratio of the first distance $L_1$ to the fourth distance La is about 1. For example, the ratio of the first distance $L_1$ to the fourth distance La is in a range from 0.9 to 1.1.

The first distance $L_1$ is approximately equal to the fourth distance $L_4$, which means that among the plurality of peripheral photo spacers 44, the distance between the second peripheral photo spacer 442 closest to the border of the display region 2 and the border of the display region 2 in the first direction is equivalent to the distance between the first peripheral photo spacer 441 closest to the border of the encapsulation region 37 and the border of the encapsulation region 37.

That is to say, in some embodiments of the present disclosure, multiple peripheral photo spacers 44 in the peripheral region 38 on a side proximate to the display region 2 are arranged at positions close to the border of the display region 2. In this way, it may be possible to effectively support the protective cover plate 39 in a region close to the display region 2, which may ameliorate or even eliminate the Newton's rings, and in turn improve the display quality of the display panel 41 including the display substrate 1.

In a scenario where the second peripheral photo spacer 442 is closer to the display region 2, the second peripheral photo spacer 442 may be located at the border of the display region 2 or at the position close to the border of the display region 2.

In some application scenarios, the peripheral photo spacers 44 are arranged by extending the display photo spacers 281 in the display region 2, and the distribution region of the peripheral photo spacers 44 extends from the border position of the display region 2 toward the encapsulation region 37 in the first direction, and extends to the vicinity of the border of the encapsulation region 37. Therefore, the fourth distance $L_4$ may be less than the first distance $L_1$.

It can be seen from the above description that the plurality of peripheral photo spacers 44 of the peripheral region 38 are designed to be close to the border of the display region 2 on the side proximate to the display region 2, and are designed to be close to the border of the encapsulation region 37 on a side proximate to the encapsulation region 37. In some embodiments, in the first direction, two ends of the distribution region of the plurality of peripheral photo spacers 44 in the peripheral region 38 are respectively at or close to the borders of the encapsulation region 37 and the display region 2. For example, the distance between the first peripheral photo spacer 441 and the second peripheral photo spacer 442 in the first direction is the third distance $L_3$, and the third distance $L_3$ is greater than or equal to 80% of the width L of the peripheral region 38.

In order to ensure the support effect of peripheral photo spacers 44 between the first peripheral photo spacer 441 and the second peripheral photo spacer 442 on the protective cover plate 39, the peripheral photo spacers 44 in the first direction should not be distributed too sparsely.

In some embodiments of the present disclosure, $L_{MAX}$ is less than or equal to a product of 20 and $L_{MIN}$ ($L_{MAX} \leq 20 \times L_{MIN}$).

That is to say, in the first direction, among the plurality of peripheral photo spacers 44, the maximum distance between two adjacent peripheral photo spacers 44 should not exceed 20 times of the minimum distance. That is, the arrangement of the peripheral photo spacers 44 should not be too sparse.

In some embodiments, the first distance $L_1$ is less than or equal to $L_{MAX}$. That is, in the first direction, the distance between the first peripheral photo spacer 441 and the border of the encapsulation region 37 is less than the maximum distance $L_{MAX}$ between two adjacent peripheral photo spacers 44. In this way, it may be possible to limit the distance from the first peripheral photo spacer 441 to the border of the encapsulation region 37 to be small, and to limit the arrangement of the peripheral photo spacers 44 in the first direction to not be too sparse.

In some embodiments, the first distance $L_1$ is less than or equal to 260 μm.

Although the proportional relationship between the first distance $L_1$ and the width L of the peripheral region 38 is determined, in the display panel 41, the widths of the first region 381, the second region 382, the third region 383 and the fourth region 384 are different, and the first distance may vary in different regions. For example, in a specific product, the first distance $L_1$ in the first region 381 is 188 μm, the first distance $L_1$ in the second region 382 is 153 μm, and the first distance $L_1$ in the third region 383 is 164 μm, and the first distance $L_1$ in the fourth region 384 is 248 µm. It can be seen that, in some products, the first distance $L_1$ is in a range from 150 µm to 260 µm.

It can be seen from the above description that the more the plurality of peripheral photo spacers 44 arranged in the peripheral region 38, the larger the support region of the protective cover plate 39, the better the support effect of the protective cover plate 39, and the greater the improvement degree of the Newton's rings. However, excessive peripheral photo spacers 44 will increase the contact area with the mask during the evaporation, thus exacerbating the problem of bonding.

In light of this, the contact area between the peripheral photo spacers 44 and the protective cover plate 39 should be limited when the support effect of the peripheral photo spacers 44 on the protective cover plate 39 is ensured. In some embodiments, an area proportion may be used to represent the distribution of the peripheral photo spacers 44 and the display photo spacers 281. An area proportion of the plurality of peripheral photo spacers 44 in the peripheral region 38 is defined as a first proportion, an area proportion of the plurality of display photo spacers 281 in the display region 2 is defined as the second proportion, and the first proportion is less than the second proportion.

In this way, when the support effect of the peripheral photo spacers 44 is taken into account, the area proportion of the peripheral photo spacers 44 is reduced, that is, the contact area between the peripheral photo spacers 44 in the peripheral area 38 and the protective cover plate 39 is reduced, thereby alleviating the problem of bonding between the peripheral photo spacers 44 and the mask during the evaporation, In some embodiments, a ratio of the first proportion to the second proportion is less than or equal to 65%, e.g., may be 60%.

The second proportion, i.e., the area proportion of the plurality of display photo spacers 281 in the display region 2, is less than 10%. The second proportion is related to the pixel arrangement. For example, for the product with the GGRB arrangement, the second proportion is about 7.6%.

In some embodiments of the present disclosure, the peripheral photo spacers 44 and the display photo spacers 281 have the same shape and size, and an area of a single peripheral photo spacer 44 is the same as an area of a single display photo spacer 281. In this case, the relationship between the first proportion and the second proportion is the relationship between the number of peripheral photo spacers 44 per unit area and the number of display photo spacers 281 per unit area. For example, in an implementation where the ratio of the first proportion to the second proportion is less than or equal to 65%, the number of peripheral photo spacers 44 per unit area is less than or equal to 65% of the number of display photo spacers 281 per unit area.

In addition, in the display panel 41 in the related art, an edge of a transfer portion 35 proximate to the border of the display region is close to the border of the display region; the transfer portion 35 is a portion of the first electrode layer 26, which is a large metal sheet or a reflective film layer; therefore, when the display region emits light for display, the transfer portion 35 will reflect the light emitted by the display region, which affects the display quality.

In light of this, in the display substrate provided in the embodiments of the present disclosure, a distance between an inner edge of the transfer portion 35 and the display region 2 is controlled, which may be possible to ameliorate the problem that the transfer portion 35 reflects the light emitted by the display region 2, and in turn prevent the light reflection of the transfer portion 35 from affecting the display quality.

Figure 20:
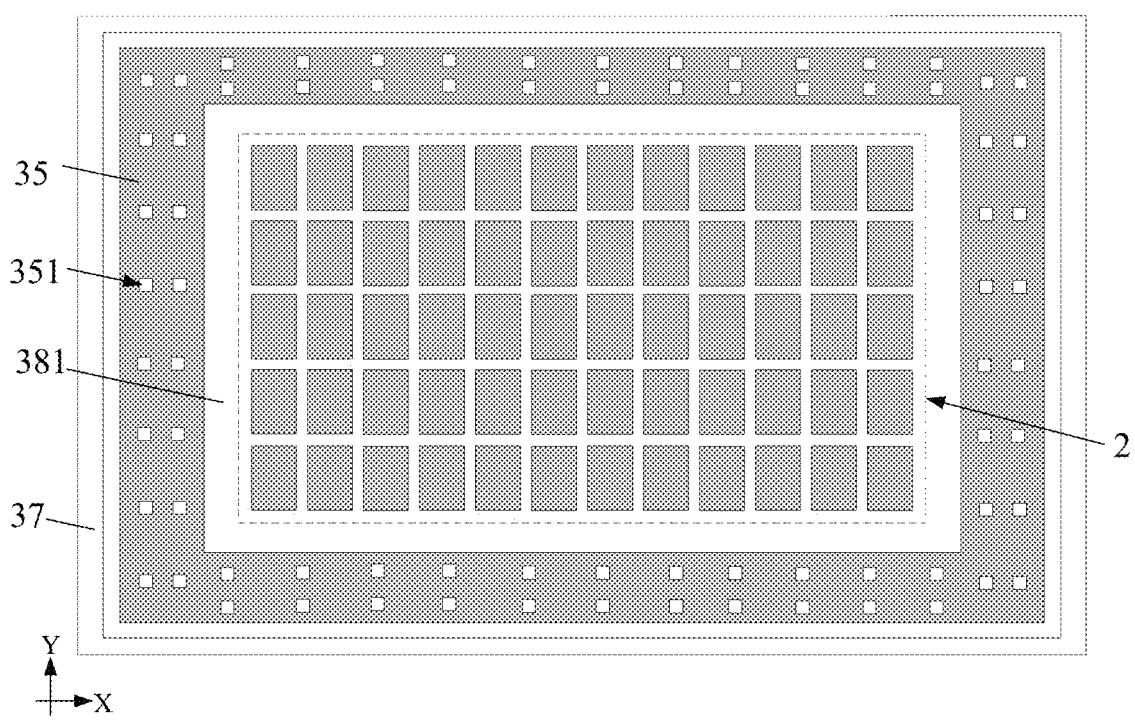
FIG. 20 is a structural diagram of a transfer portion, in accordance with some embodiments.
Figure 21:
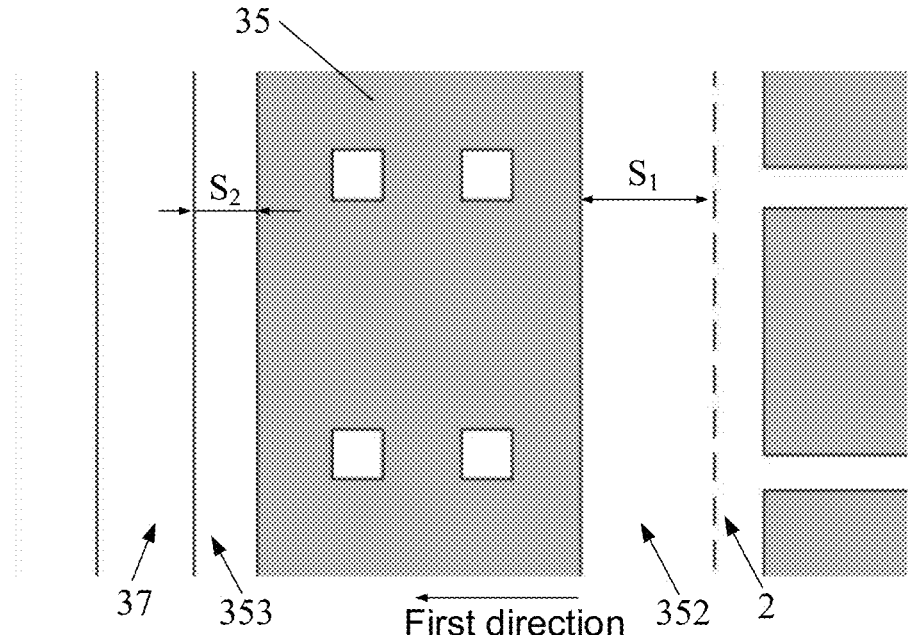
FIG. 21 is a structural diagram of the transfer portion in FIG. 20 in a first region.

Referring to FIGS. 20 and 21, there is a first gap 352 between an edge of the transfer portion 35 proximate to the display region 2 and the border of the display region 2; based on the first direction defined above, a width of the first gap 352 in the first direction is defined as a first spacing, and the first spacing is represented by $S_1$. The first spacing $S_1$ is greater than the first distance $L_1$.

In some embodiments of the present disclosure, the first spacing $S_1$ should be greater than 300 µm.

In this way, when a gap with the spacing above 300 µm exists between the edge of the transfer portion 35 proximate to the display region 2 and the border of the display region 2 in the first direction, the problem that the transfer portion 35 reflects the light emitted by the display region 2 may be significantly ameliorated. Therefore, it is possible to prevent the light reflection of the transfer portion 35 from affecting the display quality.

In an implementation where the transfer portion 35 is a closed structure that extends around, the first distances $S_1$ at different positions surrounding the display region 2 should satisfy the above gap conditions.

For example, the transfer portion 35 is a closed structure surrounding the display region 2, and the first distances $S_1$ in the first region 381, the second region 382, the third region 383 and the fourth region 384 of the peripheral region 38 are each 345 µm.

The first gap 352 may expose a structure at a corresponding position of the display substrate 1, and the structure exposed by the first gap is defined as a first exposed structure herein. A part of peripheral photo spacers 44 of the plurality of peripheral photo spacers 44 are disposed on the transfer portion 35; and the part of peripheral photo spacers 44 of the plurality of peripheral photo spacers 44 at the first gap are disposed on the first exposed structure.

That is to say, an orthographic projection of the part of peripheral photo spacers 44 of the plurality of peripheral photo spacers 44 on the base substrate 19 overlaps with an orthographic projection of the transfer portion 35 on the base substrate 19; and the orthographic projection of the part of peripheral photo spacers 44 of the plurality of peripheral photo spacers 44 on the base substrate 19 overlaps with an orthographic projection of the first exposed structure on the base substrate 19.

Figure 22:
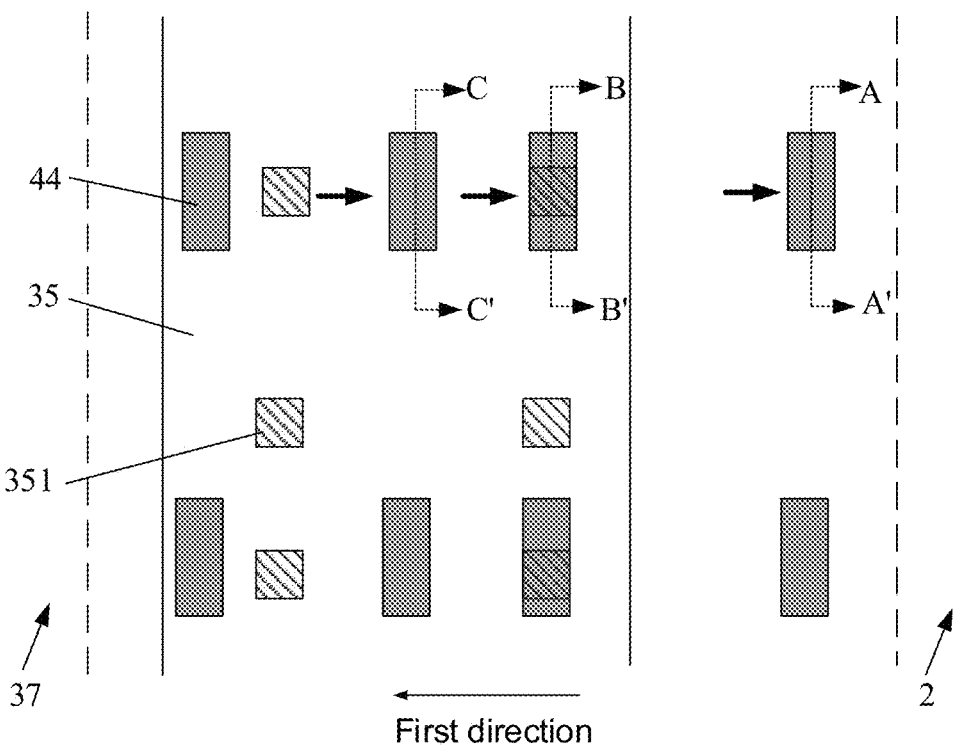
FIG. 22 is a structural diagram of a transfer portion and peripheral photo spacers, in accordance with some embodiments.
Figure 23:
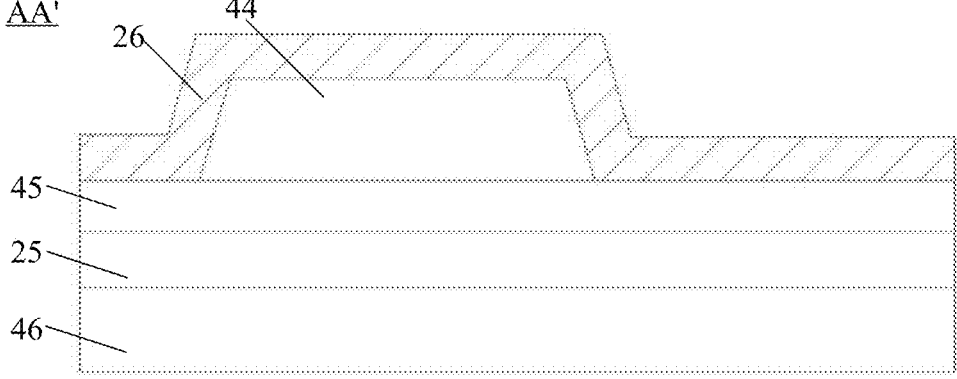
FIG. 23 is a sectional view taken along the line AA' in FIG. 22.

FIG. 22 is a structural diagram of the transfer portion and the peripheral photo spacers, in accordance with some embodiments, and FIG. 23 is a sectional view taken along the line AA' in FIG. 22. As shown in FIGS. 22 and 23, the part of peripheral photo spacers 44 of the plurality of peripheral photo spacers 44 at the first gap 352 are disposed on the first exposed structure 46.

The second planarization layer 25 is located on the first exposed structure 46, a side of the second planarization layer 25 away from the first exposed structure 46 is provided with photo spacer pads 45, sides of the photo spacer pads 45 away from the second planarization layer 25 are provided with peripheral photo spacers 44, and the peripheral photo spacers 44 support the second electrode layer 29. The photo spacer pads 45 may be arranged in the same layer as the pixel definition layer 27.

It can be seen from the above description that the GOA circuit 18 is disposed in the first region 381 and/or the second region 382 of the peripheral region 38. For the first region 381 with the GOA circuit 18 and/or the second region 382 with the GOA circuit 18, an edge of an orthographic projection, on the base substrate 19, of the GOA circuit 18 proximate to the display region 2 is closer to the display region 2 than an edge of the orthographic projection, on the base substrate 19, of the transfer portion 35 proximate to the display region 2, and the orthographic projection, on the base substrate 19, of the transfer portion 35 does not overlap or partially overlaps with the orthographic projection, on the base substrate 19, of the GOA circuit 18. The first gap exposes part or all of the GOA circuit 18, and part of peripheral photo spacers 44 of the plurality of peripheral photo spacers 44 is disposed on the exposed GOA circuit 18. Here, the GOA circuit exposed by the first gap is the first exposed structure 46.

In some embodiments, the scan driving circuit 15 includes a first driving circuit and a second driving circuit, one of the first driving circuit and the second driving circuit is configured to output row scan signals, and the other is configured to output light-emitting control signals. The first driving circuit is closer to the display region 2 than the second driving circuit.

The orthographic projection, on the base substrate 19, of the transfer portion 35 at least partially overlaps with an orthographic projection, on the base substrate 19, of the second driving circuit, and does not overlap with an orthographic projection, on the base substrate 19, of the first driving circuit. Alternatively, the orthographic projection, on the base substrate 19, of the transfer portion 35 does not overlap with the orthographic projection, on the base substrate 19, of the first driving circuit and the orthographic projection, on the base substrate 19, of the second driving circuit.

For example, the orthographic projection, on the base substrate 19, of the transfer portion 35 completely overlaps with the orthographic projection, on the base substrate 19, of the second driving circuit, and does not overlap with the orthographic projection, on the base substrate 19, of the first driving circuit.

In some other embodiments, the scan driving circuit 15 further includes a third driving circuit, and the third driving circuit is configured to output reset signals.

In the direction away from the display region 2, the first driving circuit, the third driving circuit and the second driving circuit are arranged in sequence.

The orthographic projection, on the base substrate 19, of the transfer portion 35 at least partially overlaps with the orthographic projection, on the base substrate 19, of the second driving circuit and an orthographic projection, on the base substrate 19, of the third driving circuit, and does not overlap with the orthographic projection, on the base substrate 19, of the first driving circuit. Alternatively, the orthographic projection, on the base substrate 19, of the transfer portion 35 at least partially overlaps with the orthographic projection, on the base substrate 19, of the second driving circuit, and does not overlap with the orthographic projection, on the base substrate 19, of the first driving circuit and the orthographic projection, on the base substrate 19, of the third driving circuit. Alternatively, the orthographic projection, on the base substrate 19, of the transfer portion 35 does not overlap with the orthographic projections, on the base substrate 19, of the first driving circuit, the third driving circuit and the second driving circuit.

Figure 24:
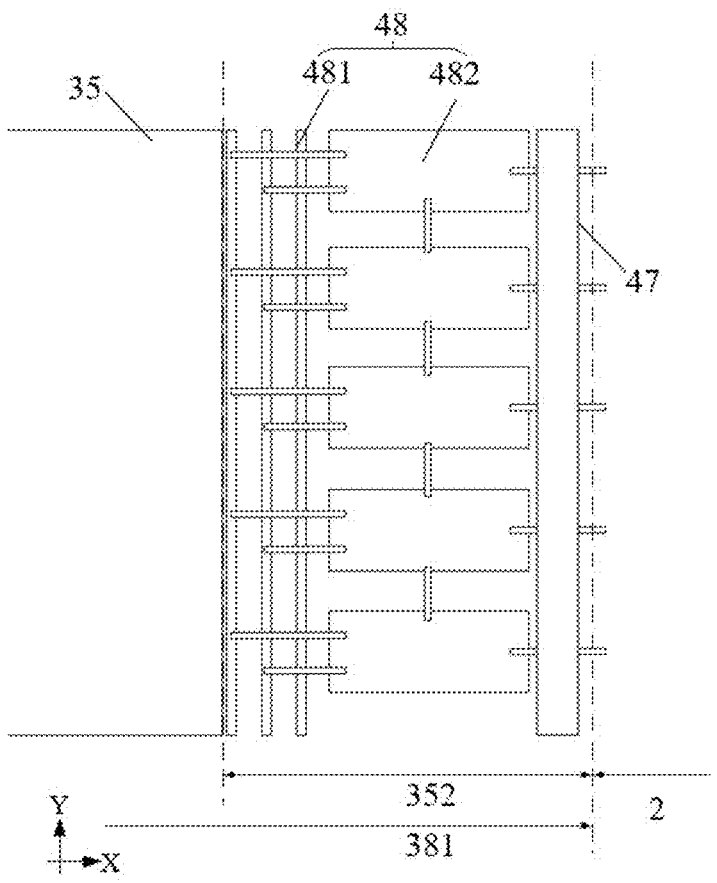
FIG. 24 is a structural diagram of a first gap of a display panel in a first region, in accordance with some embodiments.

For example, the orthographic projection, on the base substrate 19, of the transfer portion 35 overlaps with the orthographic projection, on the base substrate 19, of the second driving circuit and the orthographic projection, on the base substrate 19, of the third driving circuit, and does not overlap with the orthographic projection, on the base substrate 19, of the first driving circuit. Referring to FIG. 24, in some embodiments, the display panel includes a first initialization signal sub-line 47 located in the first region 381. The first initialization signal sub-line 47 is a portion of the initialization voltage signal line, and extends along an edge of the first region 381 adjacent to the display region 2 at a position of the first region 381 proximate to the border of the display region 2, that is, extends in the second direction.

The first driving circuit 48 includes a plurality of control signal lines 481 and a plurality of GOA units 482, the plurality of control signal lines 481 are farther away from the display region 2 than the plurality of GOA units 482, and the plurality of control signal lines 481 extend in the second direction and arranged side by side in the first direction. The plurality of GOA units 482 are arranged in the second direction and connected to the control signal lines 481.

The transfer portion 35 does not overlap the first driving circuit 48, which means that the transfer portion 35 does not overlap the plurality of control signal lines 481 and the plurality of GOA units 482, so as to expose the plurality of control signal lines 481 and the plurality of GOA units 482 by the first gap 352.

For the fourth region 384, the display substrate 1 includes the time-sharing multiplex circuit 42. An edge of an orthographic projection, on the base substrate 19, of the time-sharing multiplex circuit 42 proximate to the display region 2 is closer to the display region 2 than the edge of the orthographic projection, on the base substrate 19, of the transfer portion 35 proximate to the display region 2, and the orthographic projection, on the base substrate 19, of the transfer portion 35 does not overlap or partially overlaps with the orthographic projection, on the base substrate 19, of the time-sharing multiplex circuit 42. Part or all of the time-sharing multiplex circuit 42 is exposed by the first gap 352, and the exposed portion of the time-sharing multiplex circuit 42 is the first exposed structure 46. Part of peripheral photo spacers 44 in the plurality of peripheral photo spacers 44 is disposed on the first exposed structure 46. That is, an orthographic projection, on the base substrate 19, the part of peripheral photo spacers 44 in the plurality of peripheral photo spacers 44 overlaps with the orthographic projection, on the base substrate 19, of the time-sharing multiplex circuit 42.

For the third region 383, the display substrate 1 includes the first voltage signal line 36. An edge of an orthographic projection, on the base substrate 19, of the first voltage signal line 36 proximate to the display region 2 is closer to the display region 2 than the edge of the orthographic projection, on the base substrate 19, of the transfer portion 35 proximate to the display region 2, and the orthographic projection, on the base substrate 19, of the transfer portion 35 does not overlap or partially overlaps with the orthographic projection, on the base substrate 19, of the first voltage signal line 36. Part or all of the first voltage signal line 36 is exposed by the first gap 352, and the exposed portion of the first voltage signal line 36 is the first exposed structure 46. Part of peripheral photo spacers 44 in the plurality of peripheral photo spacers 44 is disposed on the first exposed structure 46.

Figure 25:
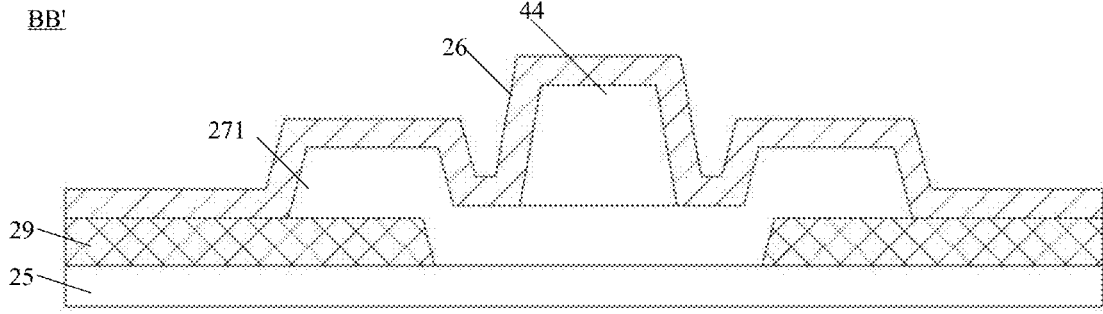
FIG. 25 is a sectional view taken along the line BB' in FIG. 22.

According to the above description, the part of peripheral photo spacers 44 in the plurality of peripheral photo spacers 44 are disposed on the transfer portion 35. In an implementation where the transfer portion 35 is provided, the peripheral photo spacers 44 are disposed at positions with through holes 351 in the transfer portion 35 and at positions with no through hole 35, Referring to FIGS. 22 and 25, peripheral photo spacers 44 are arranged at the positions with the through holes 351 in the transfer portion 35. The display substrate 1 is provided with the transfer portion 35 on the side of the second planarization layer 25. The transfer portion 35 has the through holes 351, and the through holes 351 are filled with the filling portions 271. Sides of the filling portions 271 away from the transfer portion 35 are provided with the peripheral photo spacers 44, and the peripheral photo spacers 44 support the second electrode layer 29. The second electrode layer 29 overlaps with the transfer portion 35 at a side of the peripheral photo spacers 44.

Figure 26:
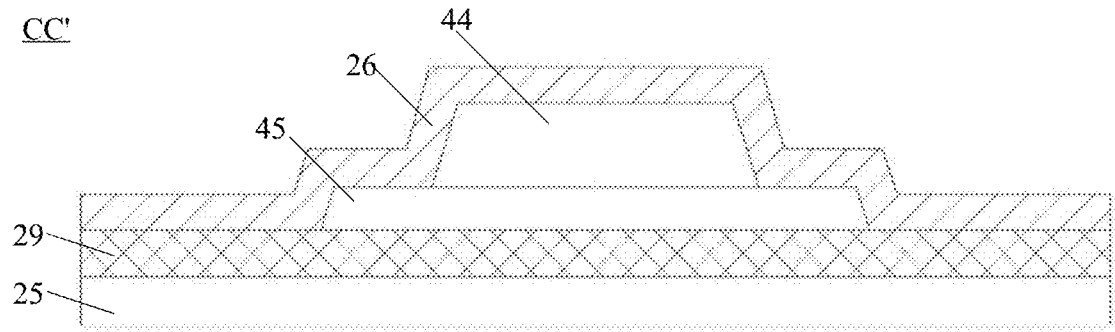
FIG. 26 is a sectional view taken along the line CC' in FIG. 22.

Referring to FIGS. 22 and 26, peripheral photo spacers 44 are arranged at the positions with no through hole in the transfer portion 35. The display substrate 1 is provided with the transfer portion 35 on the side of the second planarization layer 25, and the side of the transfer portion 35 is provided with the photo spacer pads 45. Sides of the photo spacer pads 45 away from the transfer portion 35 are provided with the peripheral photo spacers 44, the peripheral photo spacers 44 support the second electrode layer 29. The second electrode layer 29 overlaps with the transfer portion 35 at a side of the peripheral photo spacers 44.

With continued reference to FIGS. 20 and 21, an end of the transfer portion 35 away from the display region 2 may extend to a position where the encapsulation region 37 is located or extend to a position close to the encapsulation region 37. An edge of the transfer portion 35 proximate to the encapsulation region 37 and the encapsulation region 37 have a second gap 353 therebetween. A width of the second gap 353 in the first direction is defined herein as a second spacing, and the second spacing is represented by $S_2$. The second spacing $S_2$ is less than the first spacing $S_1$.

The second gap 353 may expose a structure at a corresponding position of the display substrate 1, and the structure exposed by the second gap 353 is defined as a second exposed structure. Part of peripheral photo spacers 44 in the plurality of peripheral photo spacers 44 may be disposed on the second exposed structure at the second gap 353. As for the solution of peripheral photo spacers 44 disposed on the second exposed structure at the second gap, reference may be made to the above solution of the peripheral photo spacers 44 disposed on the first exposed structure, and details will not be repeated here. No peripheral photo spacer 44 may be disposed on the second exposed structure.

Figure 27:
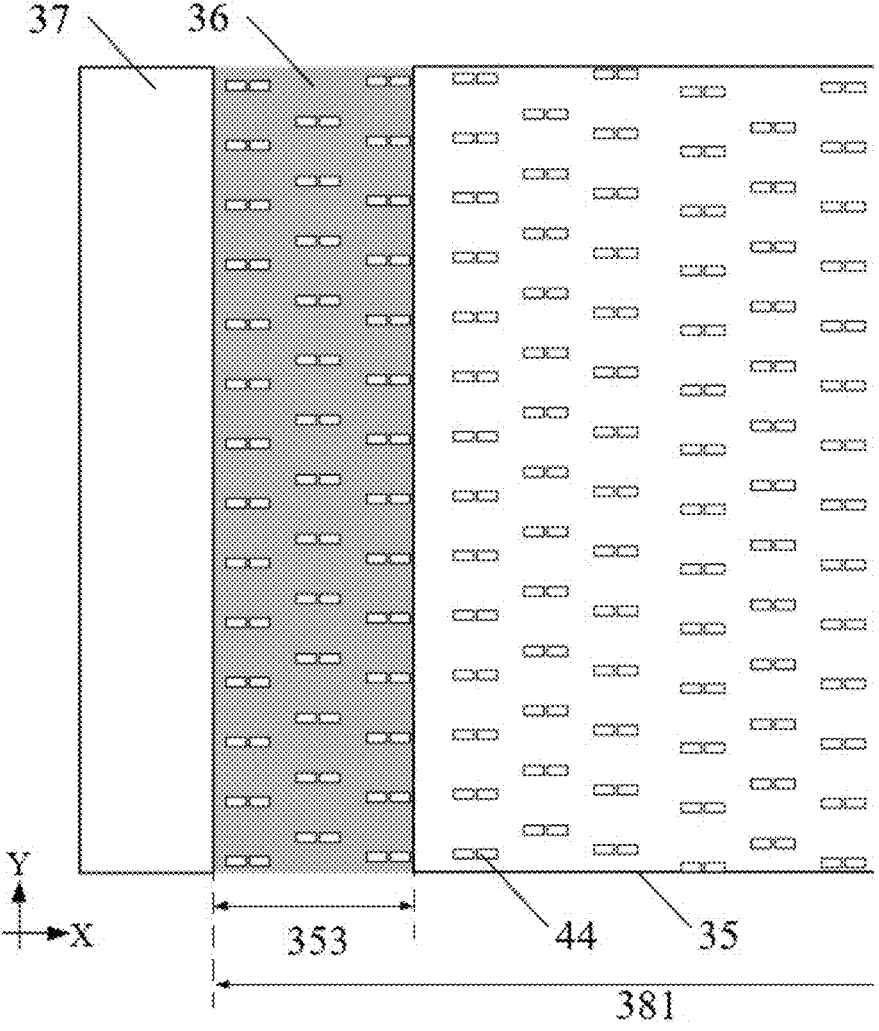
FIG. 27 is a structural diagram of a second gap of a display panel in a first region, in accordance with some other embodiments.

For example, FIG. 27 is a structural diagram of the second gap in the first region of the display panel, in accordance with some other embodiments. As shown in FIG. 27, the second gap 353 exists between the edge of the transfer portion 35 proximate to the encapsulation region 37 and the encapsulation region 37. In the first region 381, the second exposed structure exposed by the second gap 353 is the first voltage signal line 36. The first voltage signal line 36 in the first region 381 extends in a direction parallel to an edge of the first region 381 adjacent to the display region 2, i.e., extends in the second direction. The part of peripheral photo spacers 44 in the plurality of peripheral photo spacers 44 are disposed on the first voltage signal line 36 at the second gap 353, and arranged in the extending direction of the first voltage signal line 36.

Figure 28:
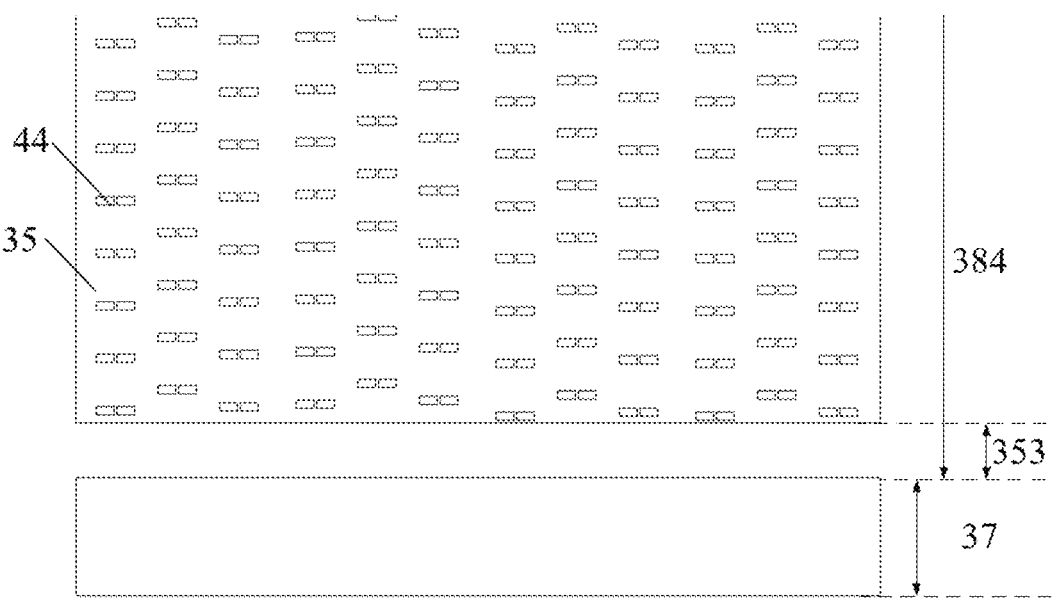
FIG. 28 is a structural diagram of a second gap of a display panel in a fourth region, in accordance with still some other embodiments.

FIG. 28 is a structural diagram of the second gap in the fourth region of the display panel, in accordance with some other embodiments. As shown in FIG. 28, the second gap 353 exists between the edge of the transfer portion 35 proximate to the encapsulation region 37 and the encapsulation region 37. In the fourth region 384, the second exposed structure exposed by the second gap 353 may be the intermediate trace(s) in the fan-out region, and no peripheral photo spacer is disposed on the second exposed structure.

Figure 29:
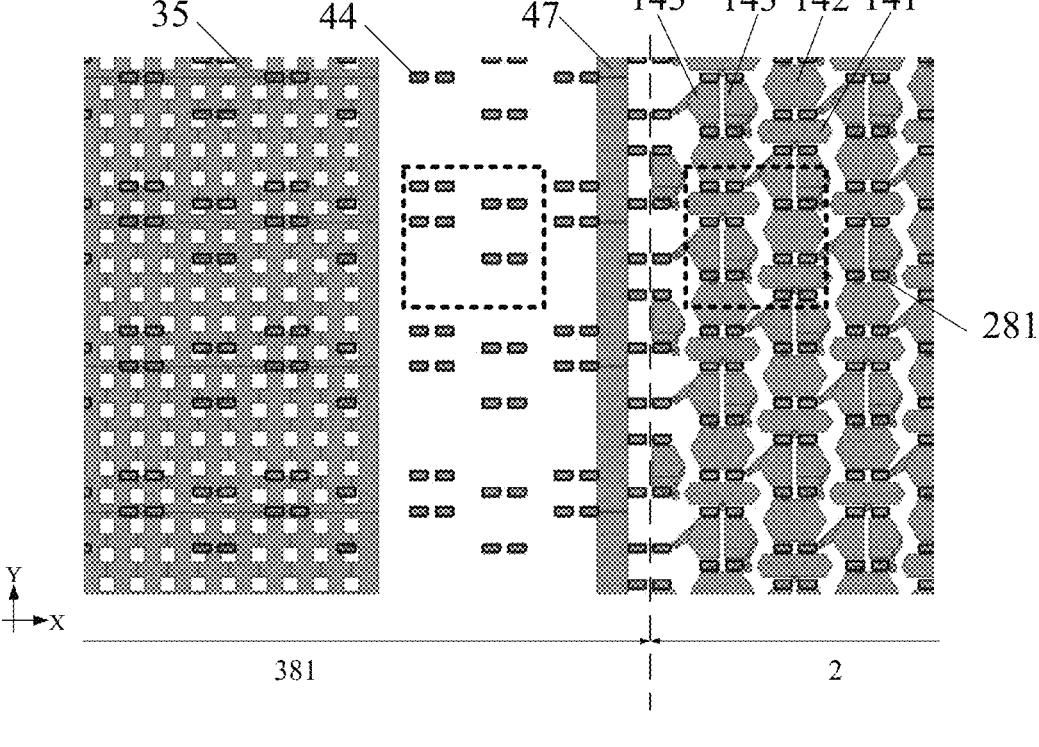
FIG. 29 is a diagram showing structures of a display panel in part of a display region and part of a first region, in accordance with still some other embodiments.

FIG. 29 is a diagram showing structures of the display panel in part of the display region and part of the first region, in accordance with some other embodiments. As shown in FIG. 29, the display panel adopts the GGRB arrangement in the display region 2, each OLED pixel unit includes one R sub-pixel, one B sub-pixel and two G sub-pixels, the two G sub-pixels are arranged in the extending direction of the scan signal lines, and the one R sub-pixel, the one B sub-pixel and the two G sub-pixels are arranged in the extending direction of the data signal lines.

Considering the orientation shown in FIG. 29 as an example, the extending direction of the scan signal lines is the horizontal direction, which is parallel to the direction of the X coordinate axis in FIG. 29, and the extending direction of the data signal lines is the vertical direction, which is parallel to the direction of the Y coordinate axis in FIG. 29. That is, in one OLED pixel unit shown in FIG. 28, two G sub-pixels are arranged in the horizontal direction, and one R sub-pixel, one B sub-pixel and two G sub-pixels are arranged in the vertical direction.

According to the above description, it can be known that the first electrode layer 26 includes the plurality of anodes 14 located in the display region 2 and the transfer portion 35 located in the first region 381. In the implementation of the GGRB arrangement, the first electrode layer 26 includes one R anode 141, one B anode 142 and two G anodes 143 in each OLED pixel unit. In one OLED pixel unit, two G anodes 143 are arranged in the horizontal direction, and one B anode 142, one R anode 141 and the two G anodes 143 are arranged in the vertical direction.

The first electrode layer 26 further includes the first initialization signal sub-line 47 located in the first region. The first initialization signal sub-line 47 is a portion of the initialization voltage signal line, and extends along an adjacent edge of the display region 2, i.e., extends in the vertical direction, at a position of the first region 381 proximate to the border of the display region 2.

The display region 2 includes a plurality of pairs of display photo spacers 281, two display photo spacers 281 in a pair of display photo spacers 281 are arranged horizontally, and each display photo spacer 281 is a rectangular structure extending in the horizontal direction. That is, the extending direction of the display photo spacer 281 is perpendicular to the extending direction of the first initialization signal sub-line.

As shown in FIG. 29, in the display region 2, in the vertical direction, a region between one R sub-pixel and one B sub-pixel that are adjacent is provided with a pair of display photo spacers 281, a region between one B sub-pixel and two G sub-pixels that are adjacent is provided with a pair of display photo spacers 281, and a region between two G sub-pixels and one R sub-pixel that are adjacent is provided with a pair of display photo spacers 281.

In one of pairs of display photo spacers 281 on a upper side and a lower side of two G sub-pixels, two display photo spacers 281 and the two G sub-pixels are in one-to one correspondence.

Figure 30:
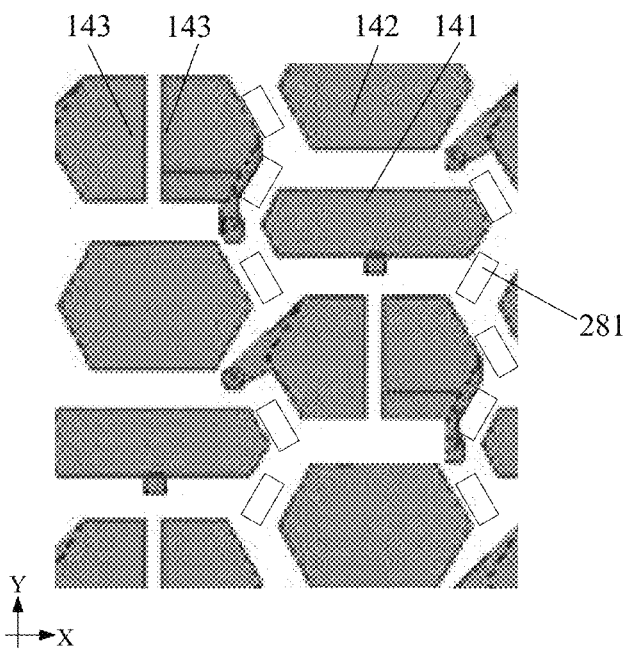
FIG. 30 is a diagram showing a partial structure of a display panel in a display region, in accordance with some embodiments.

In some embodiments, the display photo spacers 281 in the display region 2 may be arranged obliquely relative to the scan signal lines and the data signal lines. For example, as shown in FIG. 30, a display photo spacer 281 in the display region 2 is parallel to an obliqued edge of a sub-pixel.

The peripheral photo spacers 44 in the first region 381 have the same shape and size as the display photo spacers 281. The row direction of the plurality of display photo spacers 281 arranged in rows and columns is the same as the row direction of the plurality of peripheral photo spacers 44 arranged in rows and columns, and the column direction of the plurality of display photo spacers 281 arranged in rows and columns is the same as the column direction of the plurality of peripheral photo spacers 44 arranged in rows and columns. At least one row of peripheral photo spacers 44 and one row of display photo spacers 281 are located on the same straight line. In addition, the number of the rows of display photo spacers is greater than the number of the rows of peripheral photo spacers, so that the first proportion is less than the second proportion. The area proportion of the plurality of peripheral photo spacers 44 in the peripheral region 38 is the first proportion, and the area proportion of the plurality of display photo spacers 281 in the display region 2 is the second proportion.

Since the peripheral photo spacers 44 and the display photo spacers 281 have the same shape and size, an area of a single peripheral photo spacer 44 is the same as an area of a single display photo spacer 281. In this case, the relationship between the first proportion and the second proportion is the relationship between the number of peripheral photo spacers 44 per unit area and the number of display photo spacers 281 per unit area.

For example, in FIG. 29, there are two dotted square boxes with equal areas, one is located in the display region 2 and the other is located in the first region 381. The dotted square box in the display region 2 surrounds six pairs of display photo spacers 281, and the dotted square box in the first region 381 surrounds four pairs of peripheral photo spacers 44.

The relationship between the first proportion and the second proportion is not limited thereto, as long as the plurality of peripheral photo spacers and the plurality of display photo spacers are relatively even.

Figure 31:
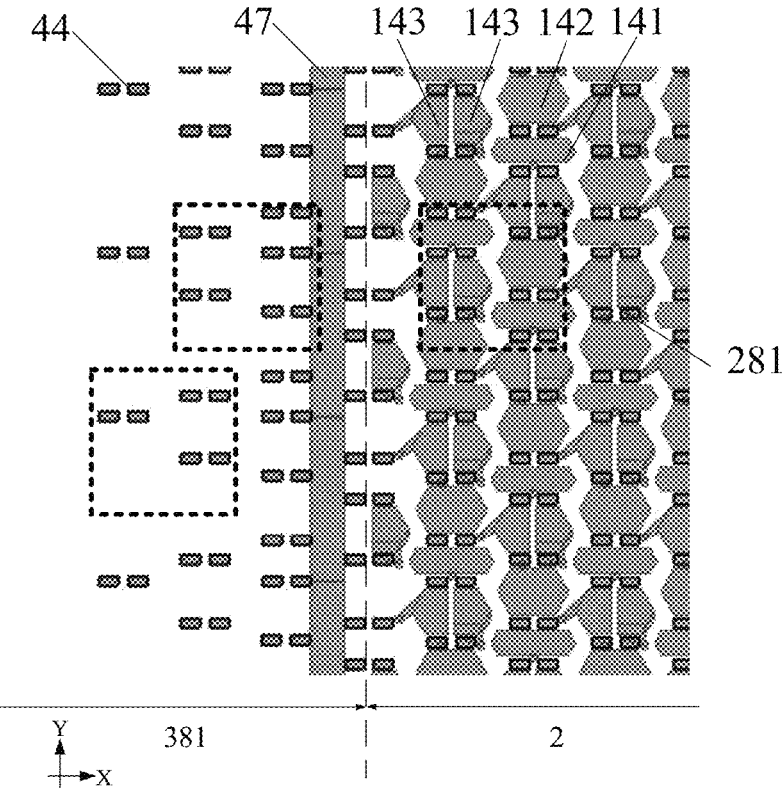
FIG. 31 is a diagram showing structures of a display panel in part of a display region and part of a first region, in accordance with still some other embodiments.

For example, as shown in FIG. 31, there are three dotted square boxes with equal areas, one is located in the display region 2 and two are located in the first region 381. The dotted square box located in the display region 2 surrounds by six pairs of display photo spacers 281, the two dotted square boxes located in the first region 381 respectively surrounds five pairs of peripheral photo spacers 44 and three pairs of peripheral photo spacers 44, and the dotted square box surrounding three pairs of peripheral photo spacers 44 is farther away from the display region 2 than the dotted square box surrounding five pairs of peripheral photo spacers 44. That is to say, in some embodiments, the farther away from the display region 2, the smaller the area proportion of the peripheral photo spacers 44.

Figure 32:
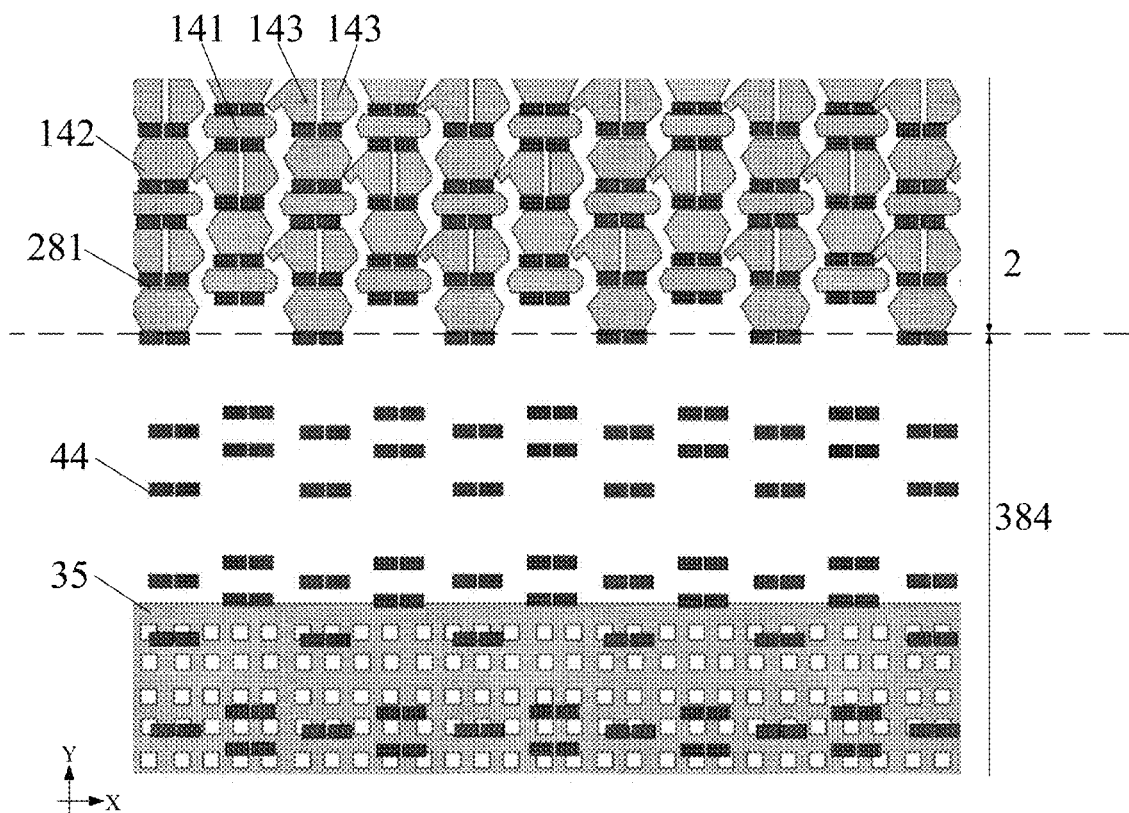
FIG. 32 is a diagram showing structures of a display panel in part of a display region and part of a fourth region, in accordance with still some other embodiments.

FIG. 32 is a diagram showing structures of the display panel in the display region and the fourth region, in accordance to yet some other embodiments. As shown in FIG. 32, the first electrode layer 26 includes the plurality of anodes located in the display region 2 and the transfer portion 35 located in the fourth region 384. The display panel includes the plurality of display photo spacers 281 located in the display region 2 and a plurality of peripheral photo spacers 44 located in the fourth region 384. As for the arrangement of the plurality of peripheral photo spacers 44 in the fourth region 384, reference may be made to the arrangement of the peripheral photo spacers 44 in the first region 381, and details will not be repeated here. It can also be seen from FIGS. 28 and 29 that the number of the columns of the plurality of peripheral photo spacers 44 and the number of the columns of the plurality of display photo spacers 281 are the same, and the columns of the plurality of peripheral photo spacers 44 are aligned with the columns of the plurality of display photo spacers 281. The number of the rows of the plurality of peripheral photo spacers 44 is less than the number of the rows of the plurality of display photo spacers 281.

Figure 33:
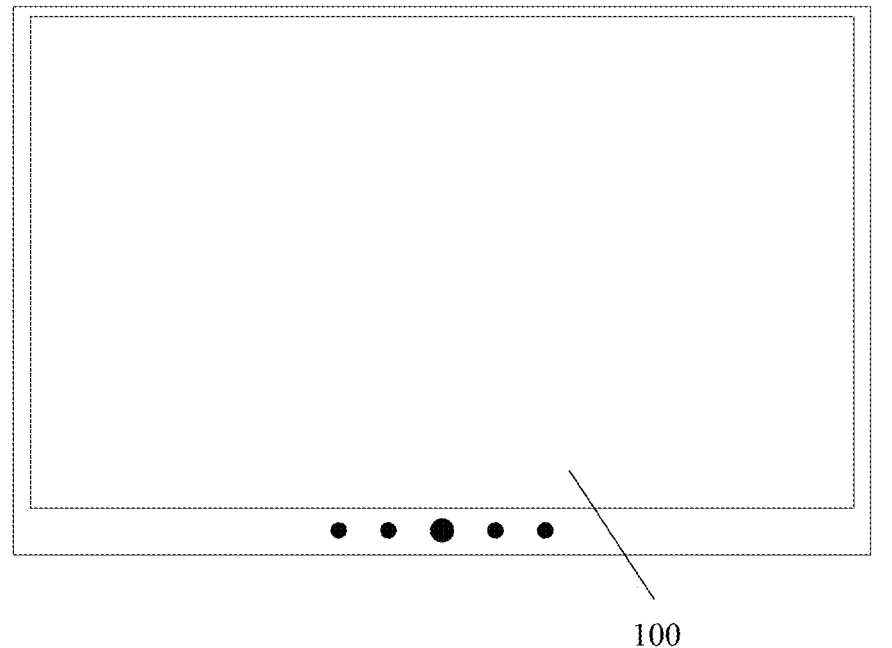
FIG. 33 is a schematic diagram of an electronic device, in accordance with some embodiments.

As shown in FIG. 33, some embodiments of the present disclosure further provide an electronic device 100 including the display panel as described in the above embodiments. The electronic device 100 is a product with a function of displaying images (including static images or motive images, where the motive images may be videos). For example, the electronic device 100 may be any one of a display, a mobile phone, a notebook computer, a tablet computer, a personal wearable device, a billboard, a digital photo frame, and an e-reader.

The electronic device 100 has the same beneficial effects as the display panel 41 provided in the embodiments described above, and details will not be repeated here.

The foregoing descriptions are merely specific implementations of the present disclosure, but the protection scope of the present disclosure is not limited thereto. Changes or replacements that any person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display substrate, having a display region, an encapsulation region located outside the display region and a peripheral region located between the display region and the encapsulation region;

the display substrate comprising:

a base substrate;

a pixel definition layer disposed on a side of the base substrate; and a photo spacer layer disposed on a side of the pixel definition layer away from the base substrate;

wherein the photo spacer layer includes a plurality of peripheral photo spacers disposed in the peripheral region;

a direction perpendicular to a border of the display region adjacent to the plurality of peripheral photo spacers is a first direction; in the first direction, a distance from a peripheral photo spacer of the plurality of peripheral photo spacers closest to the encapsulation region to the encapsulation region is a first distance, and a distance from the peripheral photo spacer of the plurality of peripheral photo spacers closest to the encapsulation region to the display region is a second distance; and the first distance is less than or equal to the second distance.

2. The display substrate according to claim 1, wherein a size of the peripheral region in a direction perpendicular to a border of the display region adjacent to the peripheral region is a width of the peripheral region, and a ratio of the first distance to the width of the peripheral region is less than or equal to 0.2.

3. The display substrate according to claim 1, wherein in the first direction, the peripheral photo spacer of the plurality of peripheral photo spacers closest to the encapsulation region is a first peripheral photo spacer, and a peripheral photo spacer of the plurality of peripheral photo spacers closest to the display region is a second peripheral photo spacer;

a distance between the first peripheral photo spacer and the second peripheral photo spacer is greater than or equal to 80% of the width of the peripheral region.

4. The display substrate according to claim 1, wherein in the first direction, a maximum distance between adjacent two peripheral photo spacers is $L_{MAX}$, and a minimum distance between adjacent two peripheral photo spacers is $L_{MIN}$;

wherein $L_{MAX} \leq 20 \times L_{MIN}$; and/or the first distance is less than or equal to $L_{MAX}$, and the first distance is less than or equal to 260 µm.

5. The display substrate according to claim 1, further comprising a plurality of display photo spacers disposed in the display region, wherein an area proportion of the plurality of peripheral photo spacers in the peripheral region is a first proportion, an area proportion of the plurality of display photo spacers in the display region is a second proportion, and the first proportion is less than the second proportion.

6. The display substrate according to claim 5, wherein the plurality of display photo spacers are arranged in rows and columns, and the plurality of peripheral photo spacers are arranged in rows and columns; and at least one row of peripheral photo spacers and one row of display photo spacers are located on a same straight line, and a number of rows of display photo spacers is greater than a number of rows of peripheral photo spacers; or a row of peripheral photo spacers and a row of display photo spacers constitute a photo spacer row, and in the photo spacer row, a distance between at least some adjacent peripheral photo spacers is equal to a distance between adjacent display photo spacers.

7. The display substrate according to claim 1, further comprising:

a first voltage signal line disposed on the base substrate, the first voltage signal line being configured to transmit a cathode signal to the display region; and a transfer portion disposed in the peripheral region, the transfer portion being electrically connected to the first voltage signal line, an edge of the transfer portion proximate to the display region and the display region having a first gap therebetween;

wherein in the direction perpendicular to the border of the display region, a spacing of the first gap is greater than the first distance.

8. The display substrate according to claim 7, wherein in the direction perpendicular to the border of the display region, the spacing of the first gap is greater than or equal to 300 µm; and/or an orthographic projection of part of peripheral photo spacers of the plurality of peripheral photo spacers on the base substrate overlaps with an orthographic projection of the transfer portion on the base substrate; and the part of peripheral photo spacers of the plurality of peripheral photo spacers are disposed in the first gap; and/or an edge of the transfer portion proximate to the encapsulation region and the encapsulation region have a second gap therebetween, and the part of peripheral photo spacers of the plurality of peripheral photo spacers are disposed in the second gap.

9. The display substrate according to claim 7, further comprising photo spacer pads disposed on sides of peripheral photo spacers of the plurality of peripheral photo spacers proximate to the base substrate; and the pixel definition layer and the photo spacers are arranged in the same layer.

10. The display substrate according to claim 9, wherein the transfer portion includes through holes, the display substrate further comprises filling portions filling the through holes, and the filling portions are arranged in the same layer as the pixel definition layer.

11. The display substrate according to claim 7, further comprising a first electrode layer, wherein the first electrode layer includes the transfer portion and a plurality of anodes located in the display region; or the transfer portion is a closed structure surrounding the display region.

12. The display substrate according to claim 7, further comprising a plurality of scan signal lines, wherein the peripheral region includes a first region and a second region distributed on two sides of the display region in an extending direction of the plurality of scan signal lines; and wherein the display substrate further comprises a scan driving circuit disposed in the first region and/or the second region, and the scan driving circuit is electrically connected to the plurality of scan signal lines;

an edge of an orthographic projection, on the base substrate, of the scan driving circuit proximate to the display region is closer to the display region than an edge of an orthographic projection, on the base substrate, of the transfer portion proximate to the display region; and the orthographic projection, on the base substrate, of the transfer portion does not overlap or partially overlaps with the orthographic projection, on the base substrate, of the scan driving circuit.

13. The display substrate according to claim 12, wherein the scan driving circuit includes a first driving circuit and a second driving circuit, one of the first driving circuit and the second driving circuit is configured to output row scan signals, and another of the first driving circuit and the second driving circuit is configured to output light-emitting control signals;

the first driving circuit is closer to the display region than the second driving circuit;

the orthographic projection, on the base substrate, of the transfer portion at least partially overlaps with an orthographic projection, on the base substrate, of the second driving circuit, and does not overlap with an orthographic projection, on the base substrate, of the first driving circuit; or the orthographic projection, on the base substrate, of the transfer portion does not overlap with the orthographic projection, on the base substrate, of the first driving circuit and the orthographic projection, on the base substrate, of the second driving circuit.

14. The display substrate according to claim 12, wherein the scan driving circuit includes a first driving circuit and a second driving circuit, one of the first driving circuit and the second driving circuit is configured to output row scan signals, and another of the first driving circuit and the second driving circuit is configured to output light-emitting control signals; the scan driving circuit further includes a third driving circuit configured to output reset signals;

in a direction away from the display region, the first driving circuit, the third driving circuit and the second driving circuit are arranged in sequence;

the orthographic projection, on the base substrate, of the transfer portion at least partially overlaps with an orthographic projection, on the base substrate, of the second driving circuit and an orthographic projection, on the base substrate, of the third driving circuit; or the orthographic projection, on the base substrate, of the transfer portion at least partially overlaps with the orthographic projection, on the base substrate, of the second driving circuit, and does not overlap with an orthographic projection, on the base substrate, of the first driving circuit and the orthographic projection, on the base substrate, of the third driving circuit; or the orthographic projection, on the base substrate, of the transfer portion does not overlap with orthographic projections, on the base substrate, of the first driving circuit, the second driving circuit and the third driving circuit.

15. The display substrate according to claim 14, wherein an orthographic projection, on the base substrate, of part of peripheral photo spacers of the plurality of peripheral photo spacers overlaps with orthographic projections, on the base substrate, of the third driving circuit and the second driving circuit.

16. The display substrate according to claim 7, further comprising a plurality of data signal lines, wherein the peripheral region includes a third region and a fourth region distributed on two sides of the display region in an extending direction of the plurality of data signal lines;

the display substrate further has a fan-out region located on a side of the fourth region away from the display region; and wherein the display substrate further comprises a time-sharing multiplex circuit disposed in the fourth region, and the time-sharing multiplex circuit is electrically connected to the plurality of data signal lines;

an edge of an orthographic projection, on the base substrate, of the time-sharing multiplex circuit proximate to the display region is closer to the display region than an edge of an orthographic projection, on the base substrate, of the transfer portion proximate to the display region, and the orthographic projection, on the base substrate, of the transfer portion does not overlap with the orthographic projection, on the base substrate, of the time-sharing multiplex circuit; and an orthographic projection, on the base substrate, of part of peripheral photo spacers of the plurality of peripheral photo spacers overlaps with the orthographic projection, on the base substrate, of the time-sharing multiplex circuit.

17. The display substrate according to claim 7, further comprising a gate metal layer and a source-drain layer disposed on the base substrate, wherein the first voltage signal line includes a first trace portion located in the gate metal layer and a second trace portion located in the source-drain layer;

an orthographic projection, on the base substrate, of the first trace portion is at least partially located in the encapsulation region, and an orthographic projection, on the base substrate, of the second trace portion is located between the encapsulation region and the display region.

18. The display substrate according to claim 1, further comprising:

a first electrode layer;

a light-emitting layer disposed on a side of the first electrode layer; and a second electrode layer disposed on a side of the light-emitting layer away from the first electrode layer;

wherein the first electrode layer includes a plurality of anodes disposed in the display region and a transfer portion disposed in the peripheral region, the plurality of anodes and the transfer portion are insulated from each other, and the second electrode layer is electrically connected to the transfer portion.

19. A display panel, comprising:

the display substrate according to claim 1;

an encapsulation adhesive disposed in the encapsulation region of the display substrate; and a protective cover plate disposed on a side of the encapsulation adhesive away from the base substrate;

wherein the protective cover plate is encapsulated on the display substrate by the encapsulation adhesive, and orthographic projections, on the base substrate, of the plurality of peripheral photo spacers of the display substrate overlap with an orthographic projection, on the base substrate, of the protective cover plate.

20. An electronic device, comprising the display panel according to claim 19.

* * * * *